US012615955B2

(12) United States Patent
Liu et al.

(10) Patent No.:  US 12,615,955 B2
(45) Date of Patent:  Apr. 28, 2026

(54) SUPPORT MEMBER, DISPLAY MODULE AND DISPLAY APPARATUS

(71) Applicant: HUBEI YANGTZE INDUSTRIAL INNOVATION CENTER OF ADVANCED DISPLAY CO., LTD., Wuhan (CN)

(72) Inventors: Yong Liu, Shanghai (CN); Jian Jin, Shanghai (CN)

(73) Assignee: Hubei Yangtze Industrial Innovation Center Of Advanced Display Co., Ltd., Wuhan (CN)

( * ) Notice: Subject to any disclaimer, the term of this patent is extended or adjusted under 35 U.S.C. 154(b) by 736 days.

(21) Appl. No.: 18/047,761

(22) Filed: Oct. 19, 2022

(65) Prior Publication Data

US 2023/0069471 A1     Mar. 2, 2023

(30) Foreign Application Priority Data

Jul. 25, 2022    (CN) .......................... 202210876932.7

(51) Int. Cl.
| | |
|---|---|
| *H10K 77/10* | (2023.01) |
| *B32B 3/26* | (2006.01) |
| *B32B 5/02* | (2006.01) |
| *B32B 5/26* | (2006.01) |

(Continued)

(52) U.S. Cl.
CPC ............ *H10K 77/111* (2023.02); *B32B 3/266* (2013.01); *B32B 5/02* (2013.01); *B32B 5/26* (2013.01); *B32B 7/03* (2019.01); *B32B 2250/20* (2013.01); *B32B 2260/023* (2013.01); *B32B 2260/046* (2013.01); *B32B 2262/101* (2013.01); *B32B 2262/105* (2013.01); *B32B 2262/106* (2013.01); *B32B 2307/546* (2013.01); *B32B 2457/20* (2013.01); *H10K 2102/311* (2023.02)

(58) Field of Classification Search
CPC .. H10K 77/111; H10K 2102/311; B32B 7/03; B32B 3/266; B32B 5/02; B32B 5/26; B32B 2250/20; B32B 2260/023; B32B 2260/046; B32B 2457/20; B32B 2457/206
See application file for complete search history.

(56) References Cited

U.S. PATENT DOCUMENTS

2022/0231239 A1*  7/2022  Ryu .......................... B32B 5/18

FOREIGN PATENT DOCUMENTS

| CN | 104346999 A | 2/2015 |
|---|---|---|
| CN | 114311872 A | 4/2022 |

(Continued)

OTHER PUBLICATIONS

Office Action issued Mar. 30, 2023, in Chinese Application No. 202210876932.7 filed Jul. 25, 2022, 12 pages.

*Primary Examiner* — Joanna Pleszczynska
(74) *Attorney, Agent, or Firm* — CHRISTENSEN O'CONNOR JOHNSON KINDNESS PLLC

(57) ABSTRACT

A support member including at least one first layer and a second layer that are stacked along a thickness direction of the support member. Each of the at least one first layer and the second layer includes a matrix and fibers. The fibers in the matrix are dispersed in the matrix. On a plane parallel to a surface of the support member, an angle α formed between an extending direction of the fiber in the first layer and an extending direction of the fiber in the second layer satisfies α>0°.

19 Claims, 21 Drawing Sheets

(51) Int. Cl.
   *B32B 7/03* (2019.01)
   *H10K 102/00* (2023.01)

(56) References Cited

FOREIGN PATENT DOCUMENTS

| CN | 216353073 U | 4/2022 |
| CN | 114523735 A | 5/2022 |

* cited by examiner

SUPPORT MEMBER, DISPLAY MODULE AND DISPLAY APPARATUS

CROSS-REFERENCE TO RELATED APPLICATION

The present disclosure claims priority to Chinese Patent Application No. 202210876932.7, filed on Jul. 25, 2022, the content of which is incorporated herein by reference in its entirety.

TECHNICAL FIELD

The present disclosure relates to the field of display technologies, and in particular, to a support member, a display module, and a display apparatus.

BACKGROUND

With the continuous development of science and technology, more and more electronic devices with display function are widely used in people's daily life and work, which brings great convenience to people's daily life and work and have become an indispensable tool of people. Compared with conventional display screens that cannot be deformed, flexible display screens including folding screens have gradually attracted people's attention because they can change their usage states through bending deformation.

The flexible display panel in the flexible display is relatively light and thin, and has poor bending resistance and poor impact resistance, and the flatness and display effect of the flexible display screen will be affected during elaborate bending and unfolding. Therefore, providing good support for the flexible display panel in the flexible display screen has become a research focus.

SUMMARY

A first aspect of the present disclosure provides a support member. The support member includes at least one first layer and a second layer that are stacked along a thickness direction of the support member. Each of the at least one first layer and the second layer includes a matrix and fibers. The fibers in the matrix are dispersed in the matrix. On a plane parallel to a surface of the support member, an angle $\alpha$ formed between an extending direction of the fibers in one first layer of the at least one first layer and an extending direction of the fibers in the second layer satisfies $\alpha > 0°$.

A second aspect of the present disclosure provides a display module. The display module includes a flexible display panel and a support member. The support member is located on a side of the flexible display panel away from a light-emitting side and includes at least one first layer and a second layer that are stacked along a thickness direction of the support member. Each of the at least one first layer and the second layer includes a matrix and fibers. The fibers in the matrix are dispersed in the matrix. On a plane parallel to a surface of the support member, an angle $\alpha$ formed between an extending direction of the fibers in one first layer of the at least one first layer and an extending direction of the fibers in the second layer satisfies $\alpha > 0°$.

A third aspect of the present disclosure provides a display apparatus. The display apparatus includes a display module. The display module includes a flexible display panel and a support member. The support member is located on a side of the flexible display panel away from a light-emitting side and includes at least one first layer and a second layer that are stacked along a thickness direction of the support member. Each of the at least one first layer and the second layer includes a matrix and fibers. The fibers in the matrix are dispersed in the matrix. On a plane parallel to a surface of the support member, an angle $\alpha$ formed between an extending direction of the fibers in one first layer of the at least one first layer and an extending direction of the fibers in the second layer satisfies $\alpha > 0°$.

BRIEF DESCRIPTION OF DRAWINGS

In order to more clearly illustrate technical solutions of embodiments of the present disclosure, the accompanying drawings used in the embodiments are briefly described below. The drawings described below are merely some embodiments of all embodiments of the present disclosure. Based on these drawings, those skilled in the art can obtain other drawings.

DESCRIPTION OF EMBODIMENTS

In order to better understand technical solutions of the present disclosure, the embodiments of the present disclosure are described in detail with reference to the drawings.

It should be clear that the described embodiments are merely some of the embodiments of the present disclosure rather than all of the embodiments. All other embodiments obtained by those skilled in the art shall fall into the scope of the present disclosure.

The terms used in the embodiments of the present disclosure are merely for the purpose of describing specific embodiment, rather than limiting the present disclosure. The terms "a", "an", "the" and "said" in a singular form in the embodiment of the present disclosure and the attached claims are also intended to include plural forms thereof, unless noted otherwise.

It should be understood that the term "and/or" used in the context of the present disclosure is to describe a correlation relation of related objects, indicating that there can be three relations, e.g., A and/or B can indicate A alone, A and B, or B alone. In addition, the symbol "/" in the context generally indicates that the relation between the objects in front and at the back of "/" is an "or" relationship.

It should be understood that although the terms 'first' and 'second' can be used in the present disclosure to describe layers, these layers should not be limited to these terms. These terms are used only to distinguish the layers from each other. For example, without departing from the scope of the embodiments of the present disclosure, a first layer can also be referred to as a second layer. Similarly, the second layer can also be referred to as the first layer.

Figure 1:
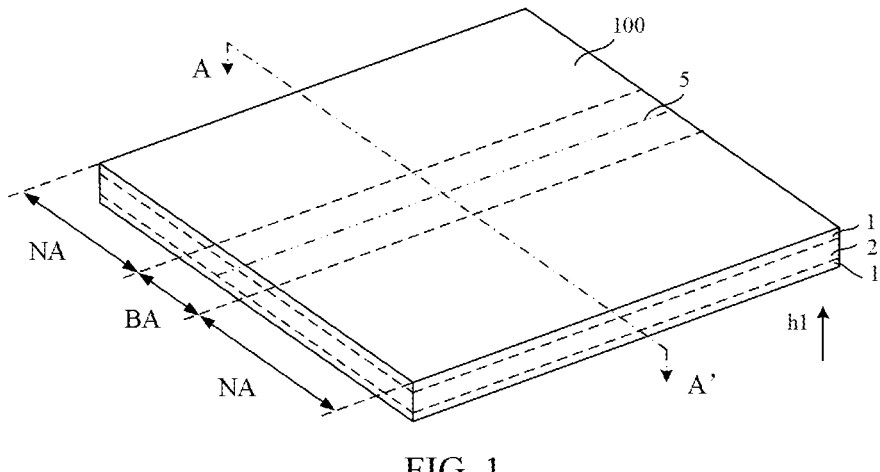
FIG. 1 is a perspective view of a support member according to some embodiments of the present disclosure.
Figure 2:
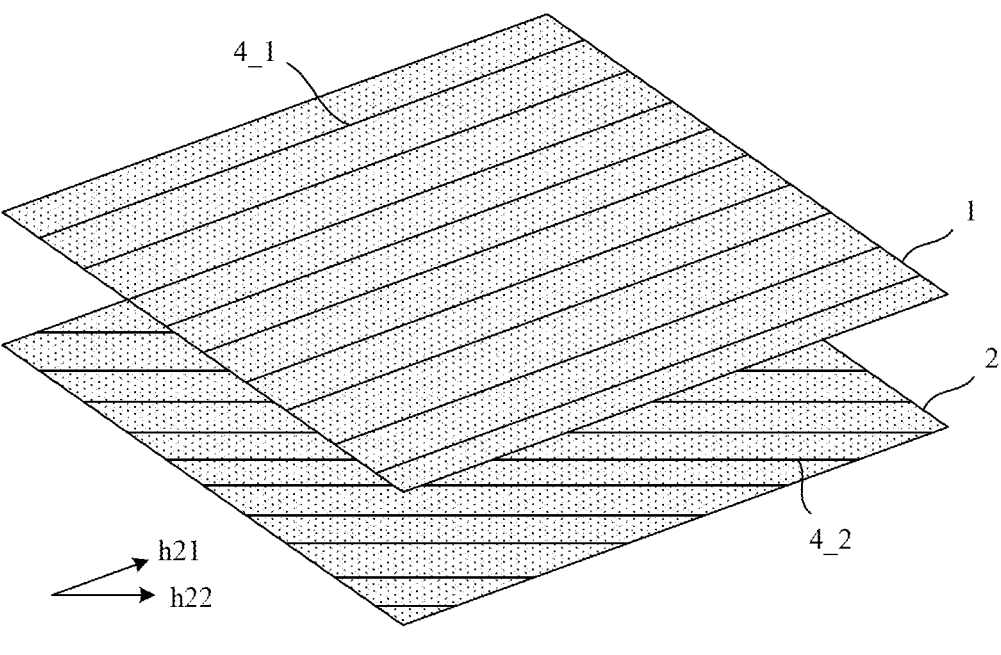
FIG. 2 is a schematic diagram illustrating extending directions of fibers in the first layer and extending directions of fibers in the second layer in a support member according to some embodiments of the present disclosure.

The present disclosure provides a support member. FIG. 1 is a perspective view of a support member according to some embodiments of the present disclosure, and FIG. 2 is a schematic diagram illustrating extending directions of fibers in the first layer and extending directions of fibers in the second layer in a support member according to some embodiments of the present disclosure. As shown in FIG. 1 and FIG. 2, the support member 100 includes a first layer 1 and a second layer 2 that are stacked along a thickness direction h1 of the support member 100. As shown in FIG. 1, the thickness direction h1 of the support member 100 is perpendicular to a plane of a surface of the support member 100.

As shown in FIG. 2, both the first layer 1 and the second layer 2 include a matrix 3 and fibers 4. Fibers 4 in the matrix 3 are dispersed in matrix 3. Hereinafter, the fibers in the first layer 1 are denoted by 4_1, and the fibers in the second layer 2 are denoted by 4_2. On a plane parallel to the surface of the support member 100, an angle $\alpha$ formed between an extending direction of the fiber 4_1 in the first layer 1 and an extending direction of the fiber 4_2 in the second layer 2 satisfies ($0<\alpha<180°$. That is, the extending direction of the fiber 4_1 in the first layer 1 is not parallel to the extending direction of the fiber 4_2 in the second layer 2. As shown in FIG. 2, the fiber 4_1 in the first layer 1 extends along a first direction h21, and the fiber 4_2 in the second layer 2 extends along a second direction h22 intersecting with the first direction h21.

In some embodiments of the present disclosure, the plane of the surface of the support member 100 can be parallel to the first direction h21 and the second direction h22. That is, the fibers 4_1 in the first layer 1 and the fibers 4_2 in the second layer 2 intersect to define the plane of the surface of the support member 100. Both the first direction h21 and the second direction h22 are perpendicular to the thickness direction h1 of the support member 100.

In the support member 100 provided by the embodiments of the present disclosure, with the configuration where the support member 100 includes the matrix 3 and the fibers 4 dispersed in the matrix 3, the resistance to tension and compression of the support member 100 can be enhanced. In this way, on the basis of ensuring resistance to tension and compression of the support member 100, there is no need to provide a support plate made of a metal material such as steel use stainless (SUS) in the support member 100. In this way, the support member 100 has better heat dissipation characteristics and lighter weight, and also facilitates the realization of a non-magnetic design of the support member 100. When the support member 100 is employed in the display apparatus, the assembly of the whole machine will not be affected, and the electrical signals in the display apparatus will not be interfered.

In some embodiments of the present disclosure, by optimizing the design of the fibers 4 in the support member 100, the support member 100 includes the first layer 1 and the second layer 2 that are arranged along the thickness direction h1 of the support member 100. By setting the extending direction of the fiber 4 in the first layer 1 to be different from the extending direction of the fiber 4 in the second layer 2, the extending directions of the fibers 4 in the first layer 1 and the second layer 2 can be set according to the positions of the layers in the support member 100, and the fibers in the first layer 1 and the fibers in the second layer 2 cooperate with each other to comprehensively improve various required properties of the support member 100, so that the support member 100 has better bending recovery to alleviate the crease while improving the strength and the impact resistance of the support member 100.

In some embodiments of the present disclosure, $10°\leq\alpha\leq170°$. For example, a can be any one of $10°$, $30°$, $45°$, $60°$, $75°$, $90°$, $135°$, and $170°$.

In some embodiments, the matrix 3 is made of at least one material including resin. The fibers 4 can include one or more of carbon fibers, silicon carbide fibers, or glass fibers.

Exemplarily, as shown in FIG. 1, the support member 100 has a bending region BA and a non-bending region NA. The bending region BA includes a bending axis 5. The support member 100 can be folded about the bending axis 5. In some embodiments of the present disclosure, an angle θ1 formed between the extending direction of the bending axis 5 and the extending direction of the fiber 4_1 in the first layer 1 satisfies $0°\leq\theta1<180°$, an angle θ2 formed between the extending direction of the bending axis 5 and the extending direction of the fiber 4_2 in the second layer 2 satisfies $0°\leq\theta2<180°$, and $\theta1\neq\theta2$.

When the support member 100 is folded about the bending axis 5, different layers in the bending region BA of the support member 100 are subjected to different bending stresses. In some embodiments of the present disclosure, the bending axis 5 has have different angles relative to the fiber 4 in the first layer 1 and the fiber 4 in the second layer 2, so that the extending directions of the fibers 4 in different layers can match with the stresses supplied to the corresponding layers during the bending, which is beneficial to reduce the possibility of brittle fracture of the fibers 4. On the basis of ensuring the reliability of the fibers 4 in the corresponding layers, the reinforcing effect of the fibers 4 can be fully exerted to ensure high strength of the support member 100.

Figure 3:
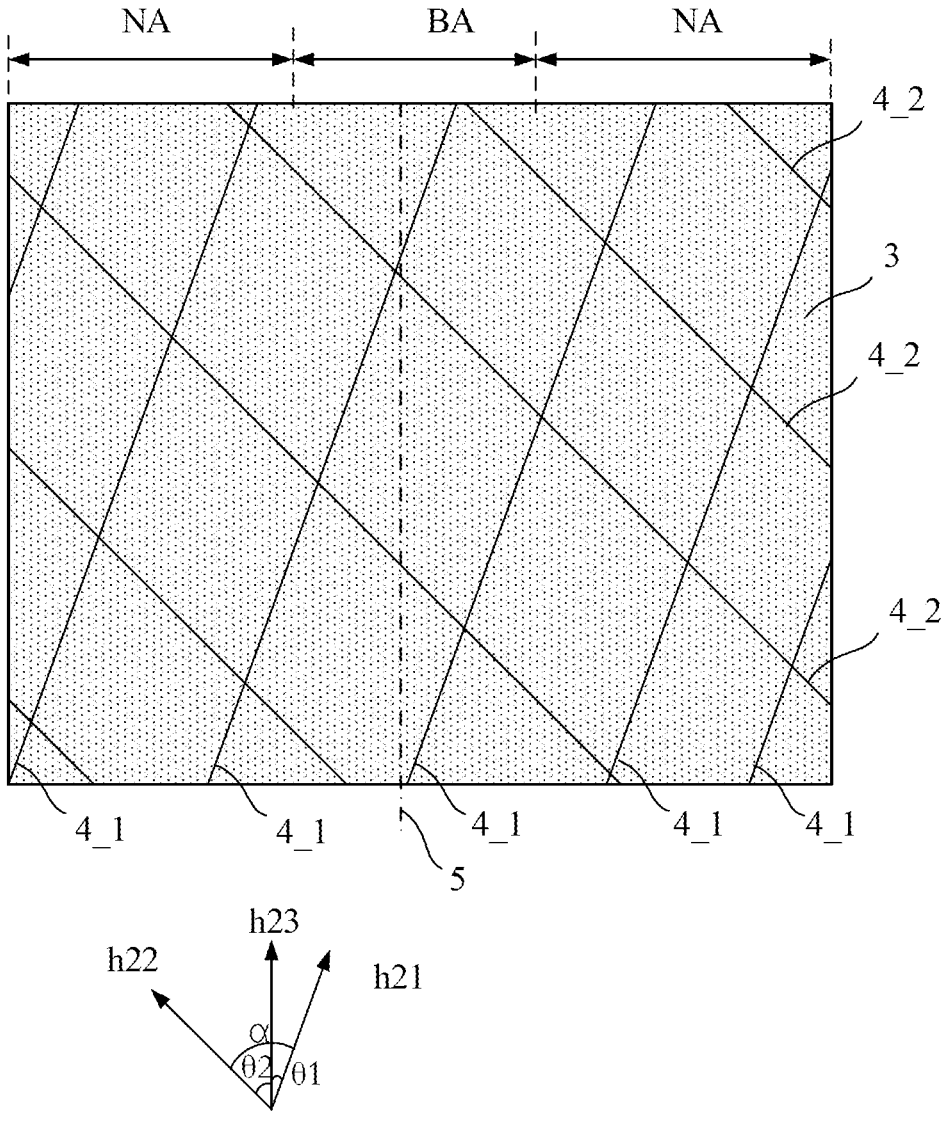
FIG. 3 is a schematic diagram of orthographic projections of a first layer and a second layer on a plane of a surface of a support member according to some embodiments of the present disclosure.

Exemplarily, as shown in FIG. 1, in some embodiments of the present disclosure, the first layer 1 can be provided on a side of the second layer 2 close to the surface of the support member 100. For example, in some embodiments of the present disclosure, a surface of the first layer 1 away from the second layer 2 can serve as the surface of the support member 100. FIG. 3 is a schematic diagram of orthographic projections of a first layer and a second layer on a plane of a surface of a support member. Referring to FIG. 3, the bending axis 5 of the support member 100 extends along a third direction h23. The third direction h23 and the first direction h21 forms an acute angle θ1, and the third direction h23 and the second direction h22 forms an acute angle θ2. In some embodiments of the present disclosure, $\theta2>\theta1$. When the support member 100 is folded about the bending axis 5, the bending stress supplied on the first layer 1 closer to the surface of the support member 100 is greater than the bending stress supplied on the second layer 2. In some embodiments of the present disclosure, a relatively small angle is formed between the extending direction of the fiber 4_1 in the first layer 1 and the bending axis 5, and a relatively large angle is formed between the extending direction of the fiber 4_2 in the second layer 2 and the bending axis 5, which can reduce the possibility of brittle fracture of the fibers 4_1 in the first layer 1 and ensure that the support member 100 has a high strength.

In some embodiments of the present disclosure, $0°\leq\theta1\leq60°$. For example, θ1 can be any one of $0°$, $5°$, $15°$, $20°$, $30°$, $45°$, and $60°$.

Exemplarily, in some embodiments of the present disclosure, $30°\leq\theta2\leq90°$. For example, θ2 can be any one of $30°$, $45°$, $60°$, $75°$, and $90°$.

Figure 4:
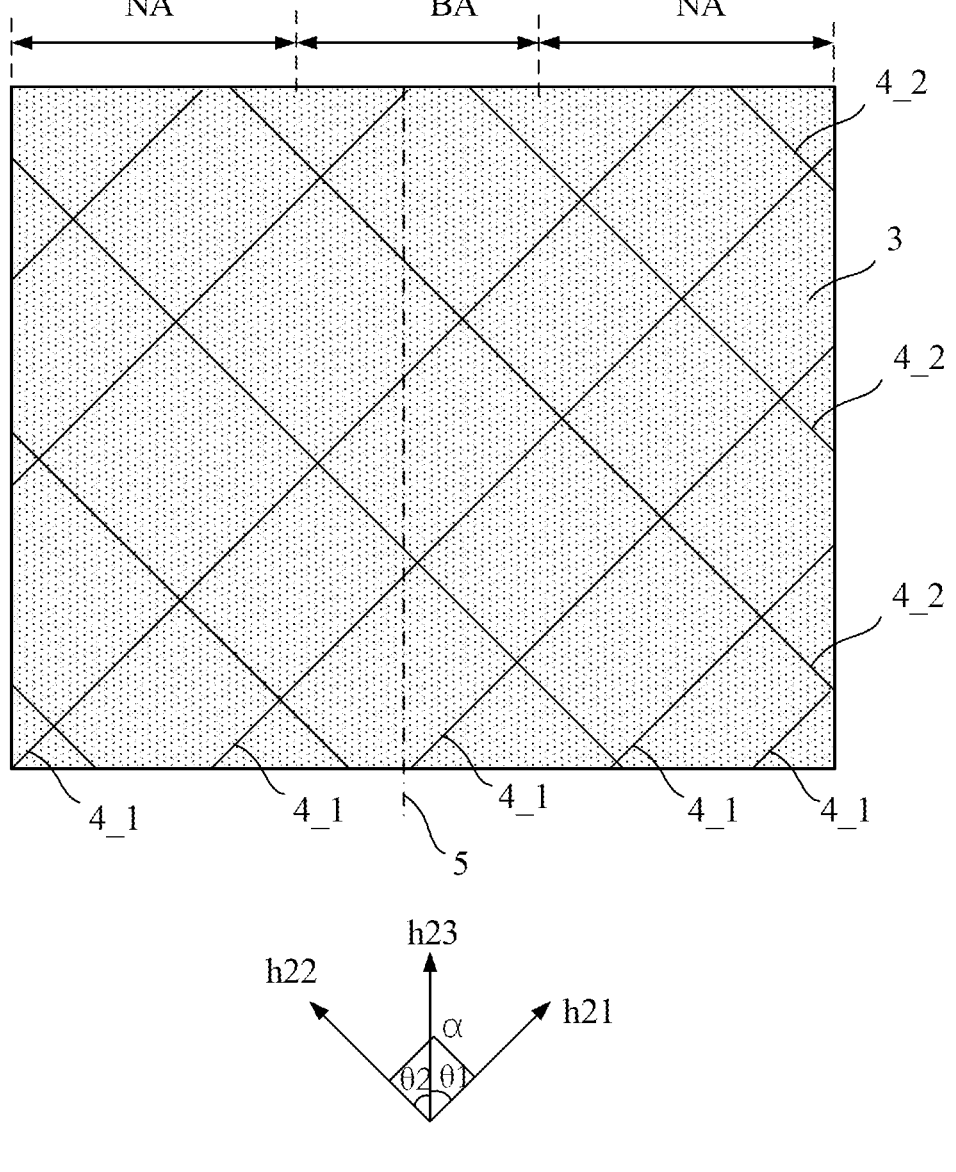
FIG. 4 is a schematic diagram of orthographic projections of a first layer and a second layer on a plane of a surface of a support member according to some embodiments of the present disclosure.

FIG. 4 is a schematic diagram of orthographic projections of a first layer and a second layer on a plane of a surface of a support member according to some embodiments of the present disclosure. In some embodiments, as shown in FIG. 4, $\alpha=90°$, and both θ1 and θ2 can be acute angles. That is, the extending direction of the fiber 4_1 in the first layer 1 and the extending direction of the fiber 4_2 in the second layer 2 are perpendicular to each other, so that a larger angle is formed between the fiber 4_1 in the first layer 1 and the fiber 4_2 in the second layer 2, thereby increasing the strengths of the support member 100 in different directions.

Figure 5:
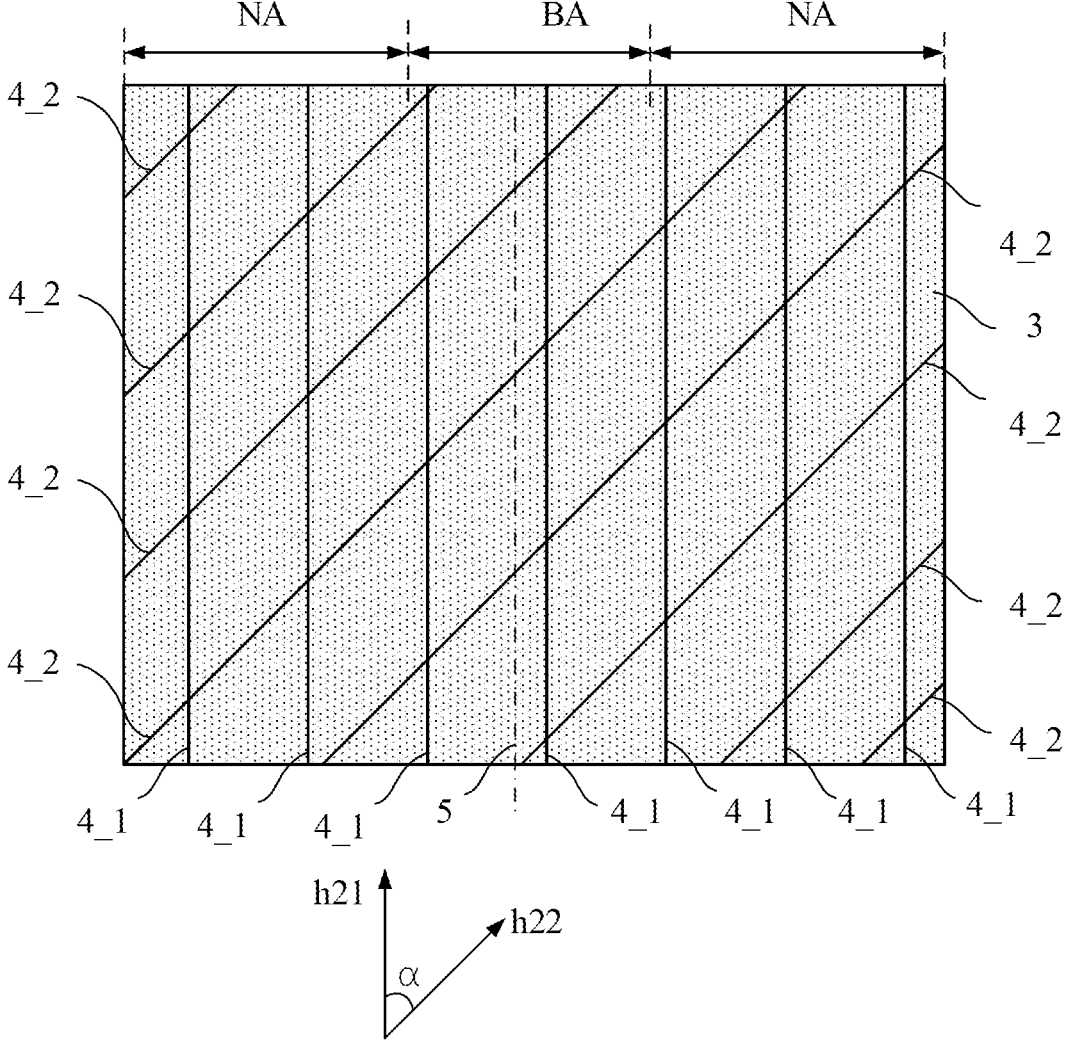
FIG. 5 is a schematic diagram of orthographic projections of a first layer and a second layer on a plane of a surface of a support member according to some embodiments of the present disclosure.

FIG. 5 is a schematic diagram of orthographic projections of a first layer and a second layer on a plane of a surface of a support member according to some embodiments of the present disclosure. In some embodiments, as shown in FIG. 5, the fibers 4_1 in the first layer 1 can be parallel to the bending axis 5, and the angle θ2 formed between the bending axis 5 and the extending direction of the fiber 4_2 in the second layer 2 can be an acute angle, and the angle α formed between the fiber in the first layer 4_1 and the fiber 4_2 in the second layer 2 can be an acute angle, that is, $\theta1=0°$, $0°<\theta2<90°$, and $0°<\alpha<90°$. Based on such configuration, not only the possibility of brittle fracture of the fibers 4_1 in the first layer 1 when the support member 100 is folded can be reduced, but also the angle formed between the fibers 4_2 in the second layer 2 and the bending axis 5 can be relatively small, which can be beneficial to reduce the possibility of brittle fracture of the fibers 4_2 in the second layer 2 and improve the overall strength of the support member 100.

In some embodiments, when $\theta1=0°$, $10°\leq\alpha\leq80°$. For example, α can be any one of $10°$, $30°$, $45°$, $60°$, and $75°$.

Figure 6:
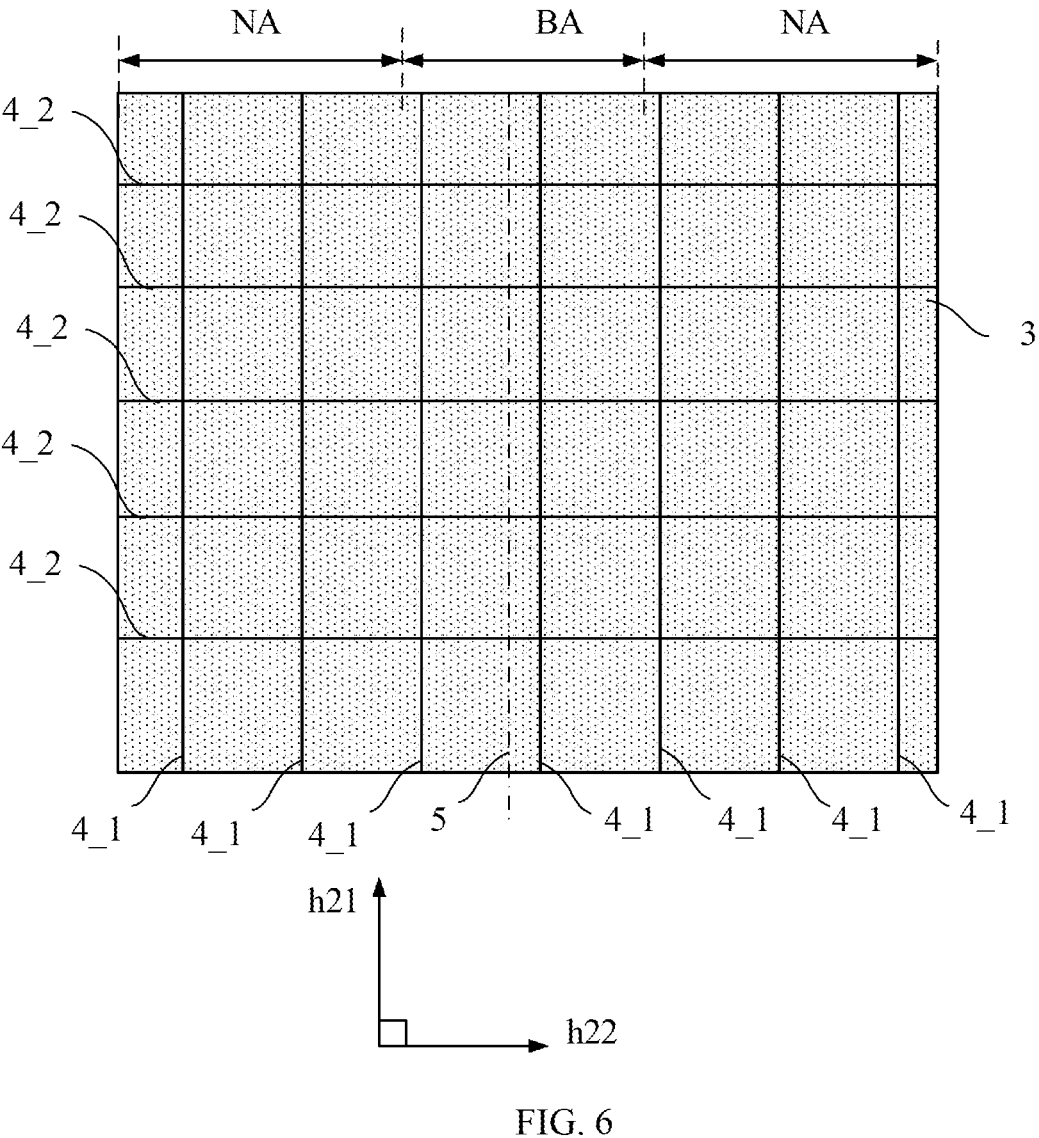
FIG. 6 is a schematic diagram of orthographic projections of a first layer and a second layer on a plane of a surface of a support member according to some embodiments of the present disclosure.

FIG. 6 is a schematic diagram of orthographic projections of a first layer and a second layer on a plane of a surface of a support member according to some embodiments of the present disclosure. In some embodiments, as shown in FIG. 6, the bending axis 5 can be parallel to the extending direction of the fiber 4_1 in the first layer 1, that is, the bending axis 5 extends along the first direction h21, and the extending direction of the fiber 4_1 in the first layer 1 can be perpendicular to the extending direction of the fiber 4_2 in the second layer 2, that is, $\theta1=0°$, $\alpha=90°$, and $\theta2=90°$, which can reduce the possibility of brittle fracture of the fibers 4_1 in the first layer 1 when the support member 100 is bent. In this way, the extending direction of the fiber 4_1 in the first layer 1 and the extending direction of the fiber 4_2 in the second layer 2 can be perpendicular to each other, so that a larger angle is formed between the fiber 4_1 in the first layer 1 and the fiber 4_2 in the second layer 2, thereby improving the overall supportability of the support member 100.

Figure 7:
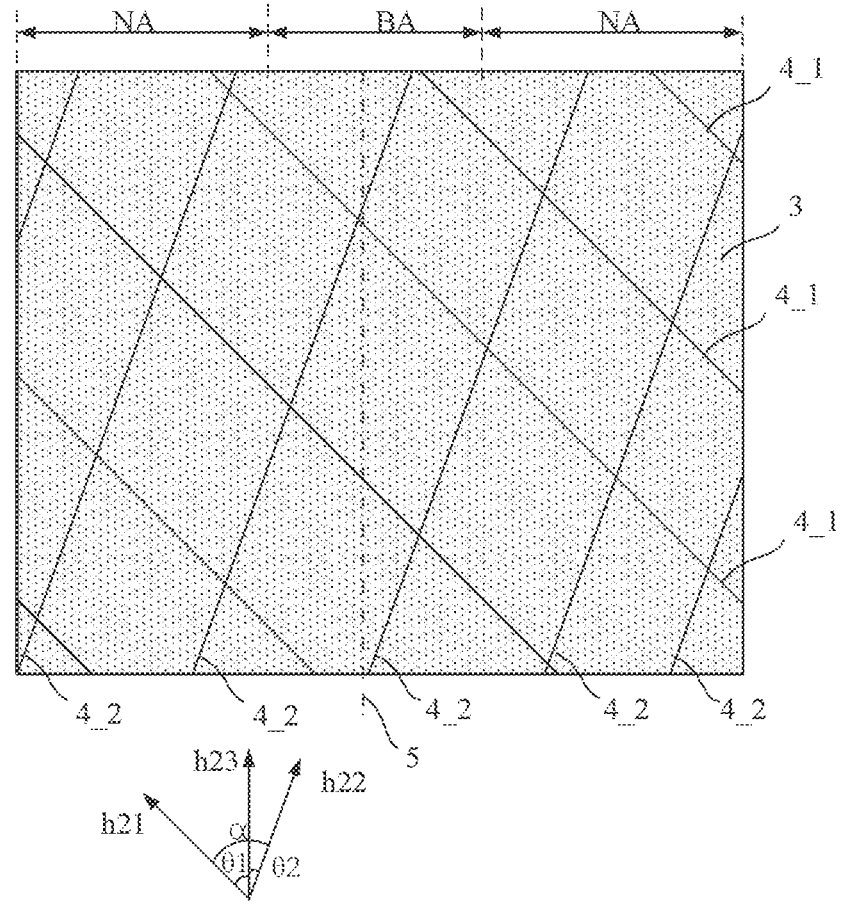
FIG. 7 is a schematic diagram of orthographic projections of a first layer and a second layer on a plane of a surface of a support member according to some embodiments of the present disclosure.

FIG. 7 is a schematic diagram of orthographic projections of a first layer and a second layer on a plane of a surface of a support member according to some embodiments of the present disclosure. In some embodiments, as shown in FIG. 7, $\theta2<\theta1$. In some embodiments, based on this setting, $\theta2\times0°$ and $0°<\theta1\leq90°$. For example, $\theta2=0°$, $\theta1=\alpha=90°$.

Exemplarily, in some embodiments of the present disclosure, the first layer 1 can be provided on the side of the second layer 2 close to the surface of the support member 100, and a thickness of the first layer 1 can be smaller than or equal to a thickness of the second layer 2. When the extending direction of the fiber 4_2 in the second layer 2 forms a larger angle with the bending axis 5, the fiber 4_2 in the second layer 2 is subjected to a larger bending stress during bending. In this way, the number of fibers 4_2 in the second layer 2 is increased by increasing the thickness of the second layer 2, which is beneficial to improve the resistance to tension and compression of the second layer 2, thereby improving the strength of the support member 100 and reducing the defects such as cracks of the support member 100 when bending.

In some embodiments, the support member 100 includes at least two first layers 1, and the second layer 2 is located between two adjacent first layers 1. As shown in FIG. 1, in some embodiments of the present disclosure, the surface of one of the two adjacent first layers 1 that is far away from the second layer 2 can serve as an upper surface of the support member 100, and the surface of another one of the two adjacent first layers 1 that is far away from the second layer 2 can serve as a lower surface of the support member 100. The upper surface and the lower surface of the support member 100 are opposite to each other along the thickness direction h1 of the support member 100.

Exemplarily, when at least two first layers 1 are provided in the support member 100, the extending directions of the fibers 4_1 in different first layers 1 can be parallel to each other or can intersect with each other.

When arranging the first layer 1 and second layer 2, exemplarily, as shown in FIG. 1, in some embodiments of the present disclosure, the first layer 1 can be adjacent to the second layer 2.

Figure 8:
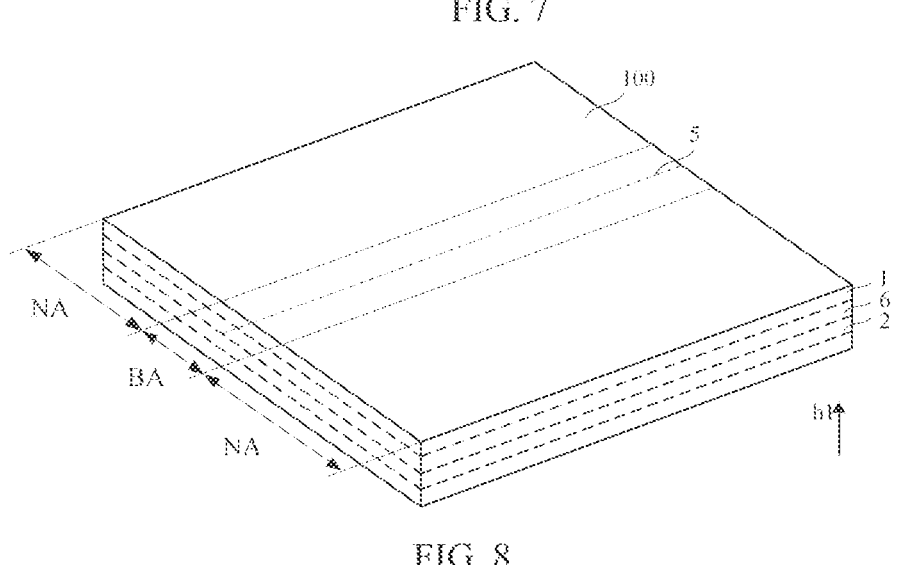
FIG. 8 is a perspective view of a support member according to some embodiments of the present disclosure.
Figure 9:
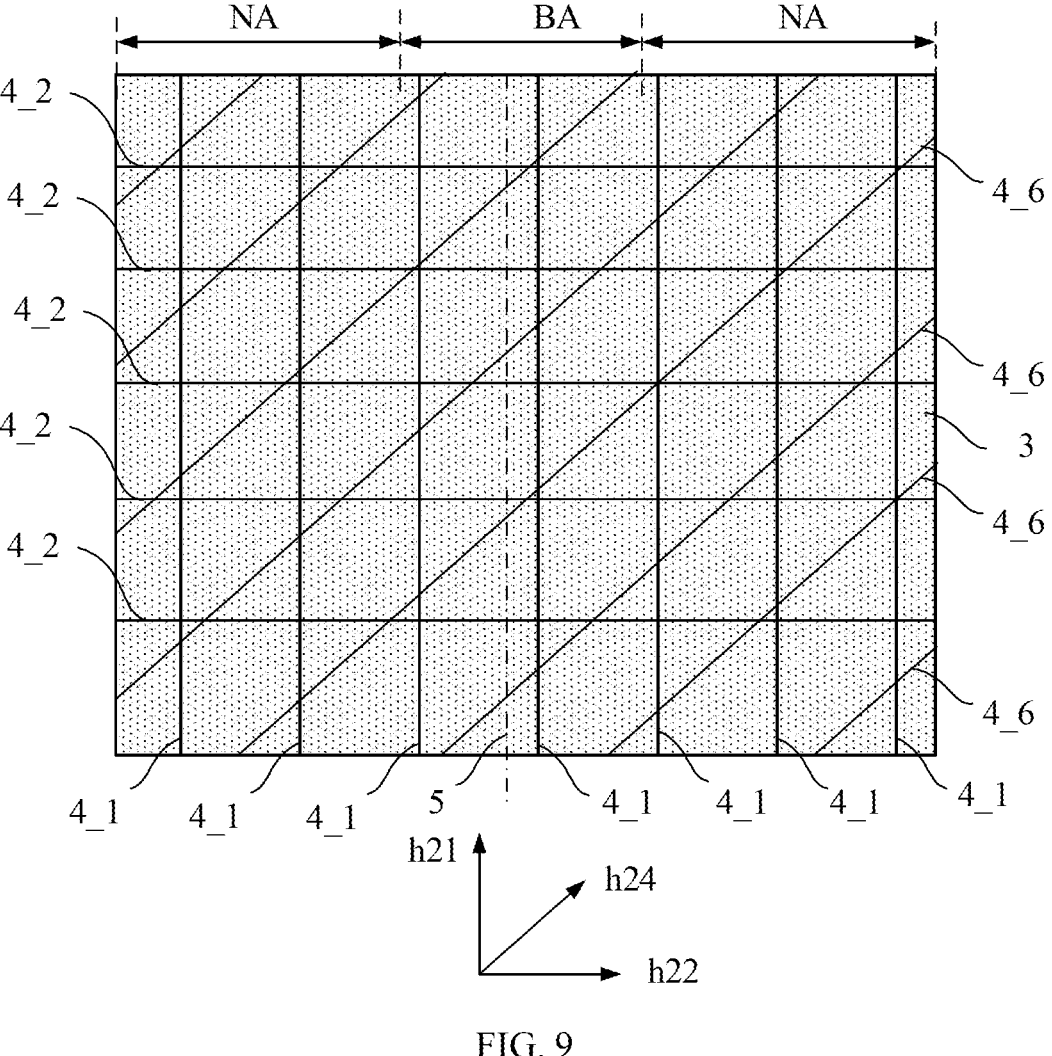
FIG. 9 is a schematic diagram of orthographic projections of a first layer, a second layer and a spacer layer on a plane of a surface of a support member, according to some embodiments of the present disclosure.

FIG. 8 is a perspective view of a support member according to some embodiments of the present disclosure. In some embodiments of the present disclosure, as shown in FIG. 8, a spacer layer 6 can be provided between the first layer 1 and the second layer 2, and the spacer layer 6 also includes a matrix 3 and fibers 4. FIG. 9 is a schematic diagram of orthographic projections of a first layer, a second layer, and a spacer layer on a plane of a surface of a support member, according to some embodiments of the present disclosure. Referring to FIG. 9, an extending direction of the fiber 4_6 (the fibers 4 in the spacer layer 6 are denoted by 4_6) in the spacer layer 6 is a fourth direction h24. The fourth direction h24 is different from the extending direction of the fiber 4_1 in the first layer 1, and is also different from the extending direction of the fiber 4_2 in the second layer 2. The configuration of the fibers 4_6 in the spacer layer 6 can make the extending directions of the fibers 4 in the support member 100 more diverse, which is beneficial to finely adjust the performance of the support member 100.

In some embodiments, an angle θ3 formed between the extending direction of the bending axis 5 and the extending direction of the fiber 4_6 in the spacer layer 6 satisfies θ1<θ3<θ2. With such configuration, the extending directions of the fibers 4 can be gradually adjusted between the first layer 1 and the second layer 2 to adapt to the stress distribution in all layers of the support member 100 in a bent state, thereby improving the strength of the support member 100. FIG. 9 exemplarily illustrates that the extending direction of the bending axis 5 is parallel to the first direction h21.

When arranging the fibers in each layer of the support member 100, for example, as shown in FIG. 2, FIG. 3, FIG. 4, FIG. 5, FIG. 6, FIG. 7, and FIG. 9, the embodiments of the present disclosure can make the fibers 4 in the first layer 1 and the second layer 2 be uniformly and equally distributed at different positions, so that the impact resistance at different positions in the support member 100 tends to be consistent. With such configuration, when the support member 100 is employed in a display apparatus to provide support for the flexible display panel, the support member 100 can provide a more uniform support for the flexible display panel at different positions.

In some embodiments of the present disclosure, at least one of the first layer 1, the second layer 2, or the spacer layer 6 can include a first region A1 and a second region A2. A fiber density in the first region A1 is greater than a fiber density in the second region A1. According to different positions of the regions, the functions required to be realized by the different regions of the support member 100 are correspondingly different. In some embodiments of the present disclosure, by differentially setting the fiber densities in different regions in the same layer of the support member 100, the fiber densities can be set to match their positions, and the fibers in different regions in the same layer can cooperate with each other, which is conducive to function the reinforcing effect of the fibers, so that the strength and impact resistance of the support member 100 are improved.

Figure 10:
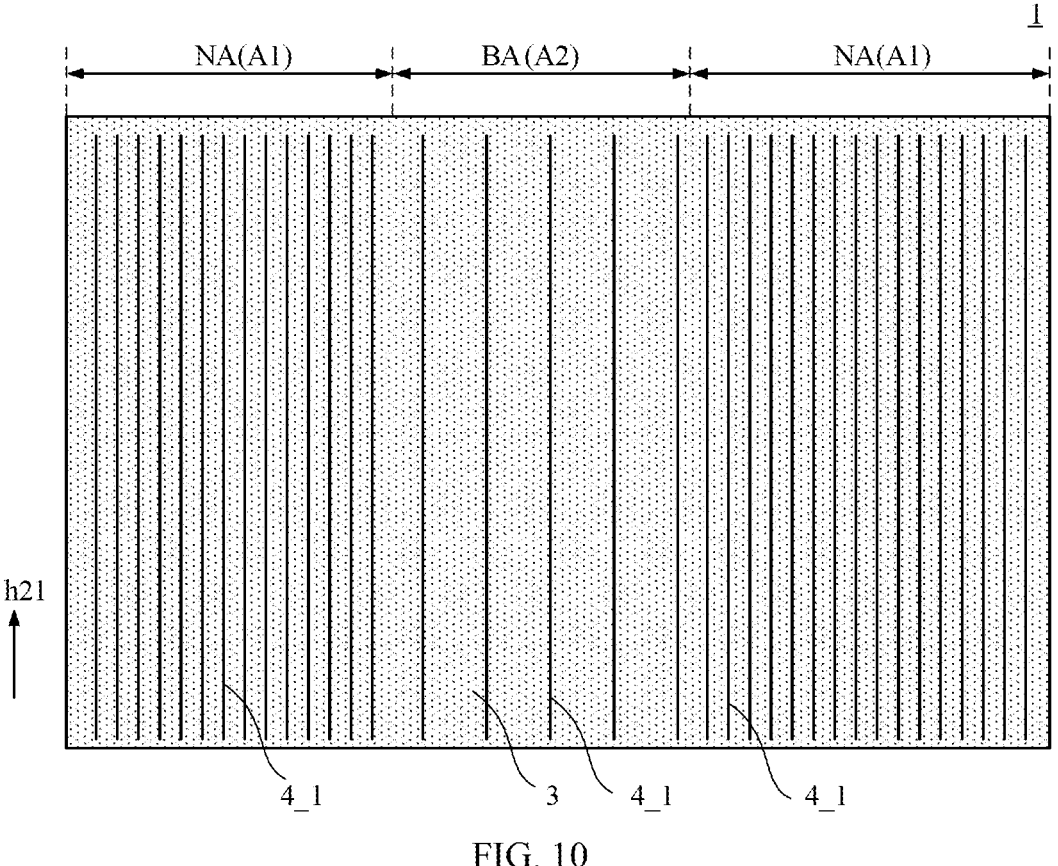
FIG. 10 is a schematic diagram of an orthographic projection of a first layer on the plane of a surface of a support member according to some embodiments of the present disclosure.

FIG. 10 is a schematic diagram of an orthographic projection of a first layer on the plane of a surface of a support member according to some embodiments of the present disclosure. Exemplarily, as shown in FIG. 10, the first layer 1 has a first region A1 and a second region A1. The fiber density in the first region A1 is greater than the fiber density in the second region A2.

In some embodiments, when the support member 100 includes a bending region BA and a non-bending region NA (as shown in FIG. 10), the non-bending region NA of the support member 100 can include the first region A1, and the bending region BA can include the second region A2. With such configuration, on the one hand, the bending region BA can be more easily bent, so as to ensure better bendable properties of the support member 100. The fiber density in the bending region BA can also be reduced, the processing difficulty of the bending region BA can be reduced, and the process efficiency can be improved. On the other hand, by increasing the fiber density in the non-bending region NA, it is beneficial to increase the impact resistance of the non-bending region NA. When subjected to an external impact force, the support member 100 can better maintain its own mechanical structure, thereby reducing the possibility of deformation such as pits.

Exemplarily, at least in the non-bending region NA of the support member 100, in some embodiments of the present disclosure, at least one of the first layer 1 or the second layer 2 can include both the first region A1 and the second region A2. The first regions A1 and the second regions A2 are alternately arranged in the non-bending region NA of the corresponding layer. That is, in the non-bending region NA, the fiber density in at least one layer of the support member 100 is non-uniform.

Figure 11:
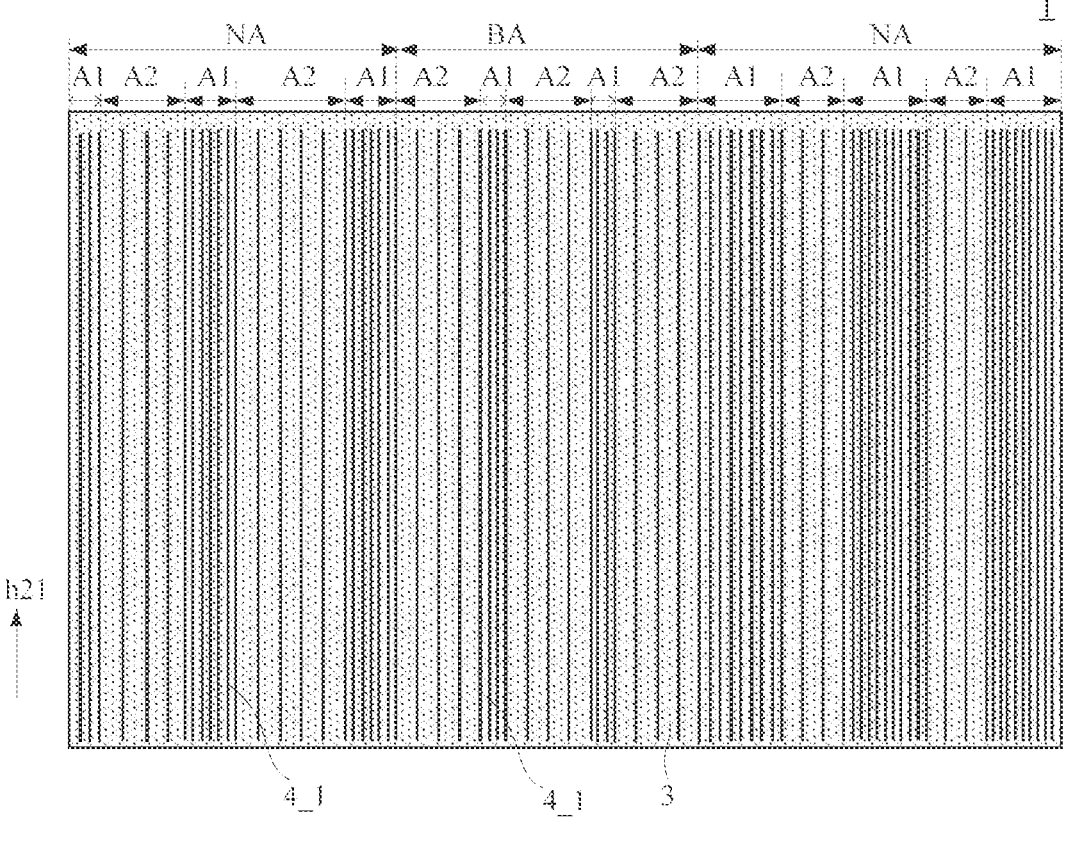
FIG. 11 is a schematic diagram of an orthographic projection of a first layer on the plane of a surface of a support member according to some embodiments of the present disclosure.

FIG. 11 is a schematic diagram of an orthographic projection of a first layer on the plane of a surface of a support member according to some embodiments of the present disclosure. Taking the first regions A1 and the second regions A2 that are arranged alternately in both the non-bending region NA and the bending region BA of the first layer 1 as an example, exemplarily, as shown in FIG. 11, in the non-bending region NA of the support member 100, the first layer 1 includes multiple first regions A1 and multiple second regions A2. The first regions A1 and the second regions A2 are alternately arranged in the non-bending region NA. In the bending region BA of the support member 100, the first layer 1 also includes multiple first regions A1 and multiple second regions A2. The first regions A1 and the second regions A2 are alternately arranged in the bending region BA.

The support member 100 is usually manufactured as follows. Firstly, the internal structures such as the matrix 3 and the fiber 4 required for the support member 100 are manufactured on a large-area raw material of the support member, and then the large-sized raw material of the support member is cut to obtain the support member 100 of the desired size. With such configuration, in some embodiments of the present disclosure, multiple dispersed second regions A2 with smaller fiber density can be set in the raw material of the support member, and then any part of the second region A2 can serve as the bending region BA of the support member 100, and any other part of the second region can serve as the non-bending region NA of the support member 100, therefore the process operation is simple. When some structures in the bending region BA that can improve the bending property of the bending region BA are required to be arranged in the bending region BA, such configuration reduces the difficulty of selecting the bending region BA in raw material of the support member with a large area, thereby increasing the process efficiency.

With such configuration, the non-bending region NA and the bending region BA in a same layer in the support member 100 can both include the first region A1 and the second region A2, which is beneficial to make the impact resistance of the bending region BA and the non-bending region NA tend to be consistent.

Exemplarily, in multiple first regions A1 and multiple second regions A2 in the non-bending region NA, in the embodiments of the present disclosure, the fiber densities of the multiple first regions A1 can be the same, or the fiber densities of the multiple second regions A2 can be the same. In some embodiments of the present disclosure, the density of the first regions A1 or the density of the second regions A2 can also be different from each other. For example, along a direction from the non-bending region NA to the bending region BA, the embodiments of the present disclosure can gradually reduce the fiber density in each of first regions A1 or second regions A2. In FIG. 11, schematically, the fiber density in each first region A1 in the non-bending region NA is the same, and the fiber density in each second region A2 is the same.

Exemplarily, areas of different first regions A1 can be the same or different from each other, and the areas of different second regions A2 can be the same or different from each other.

Figure 12:
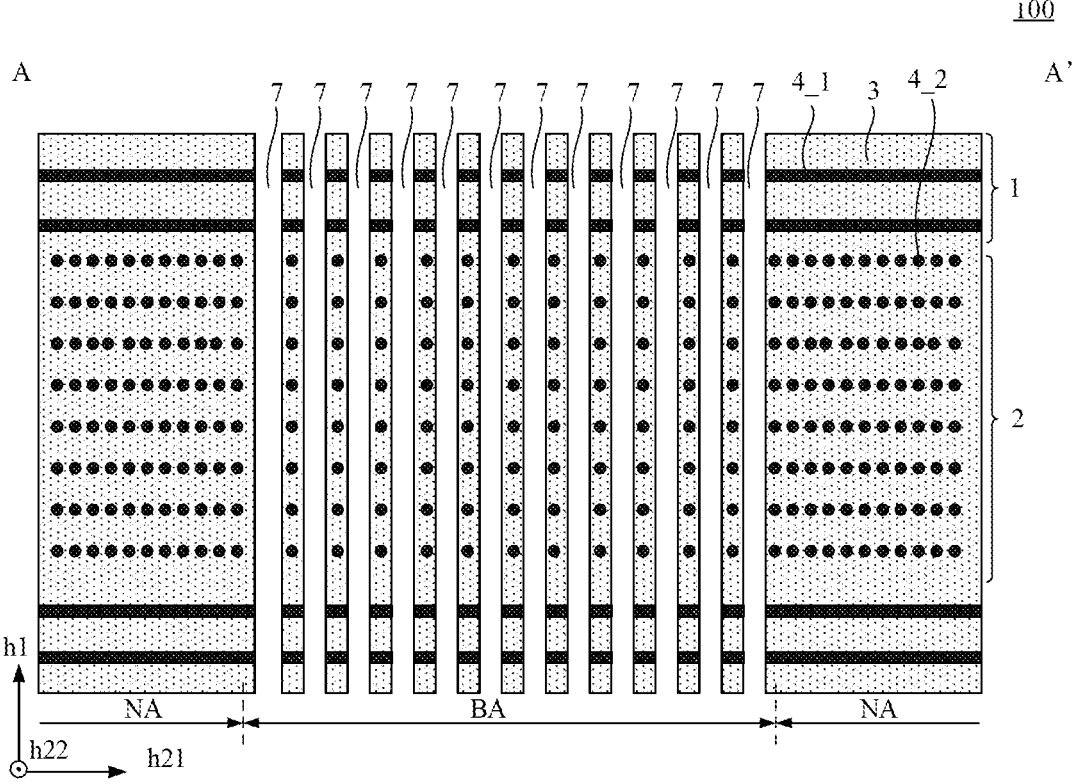
FIG. 12 is a sectional view along AA' shown in FIG. 1 according to some embodiments of the present disclosure.

Exemplarily, the support member 100 is further provided with hollows in the bending region BA. FIG. 12 is a sectional view along AA' shown in FIG. 1 according to some embodiments of the present disclosure. As shown in FIG. 12, schematically, the first direction h21 and the second direction h22 are perpendicular to each other, both the first direction h21 and the second direction h22 are perpendicular to the thickness direction h1 of the support member 100, and the hollows 7 are located in the bending region BA of the support member 100. In some embodiments, the hollows 7 penetrate through the support member 100 along the thickness direction h1 of the support member 100. The hollows 7 can release the stress of the bending region BA of the support member 100 in the bending state, so that local stress concentration problem can be improved, thereby reducing defects such as cracks in the bending region BA.

FIG. 12 schematically shows that the first direction h21 and the second direction h22 are perpendicular to each other. As mentioned above, in the embodiments of the present disclosure, the angle formed between the extending direction of the fiber 4_1 in the first layer and the extending direction of the fiber 4_2 in the second layer 2 can be not zero degree, which will not illustrated in the drawings herein. The number of the hollows 7 in FIG. 12 is only for illustration. In some embodiments of the present disclosure, the number of hollows 7 can be adjusted according to different design requirements, for example, according to the bending radius required to be achieved by the support member 100, which will not limited herein.

Figure 13:
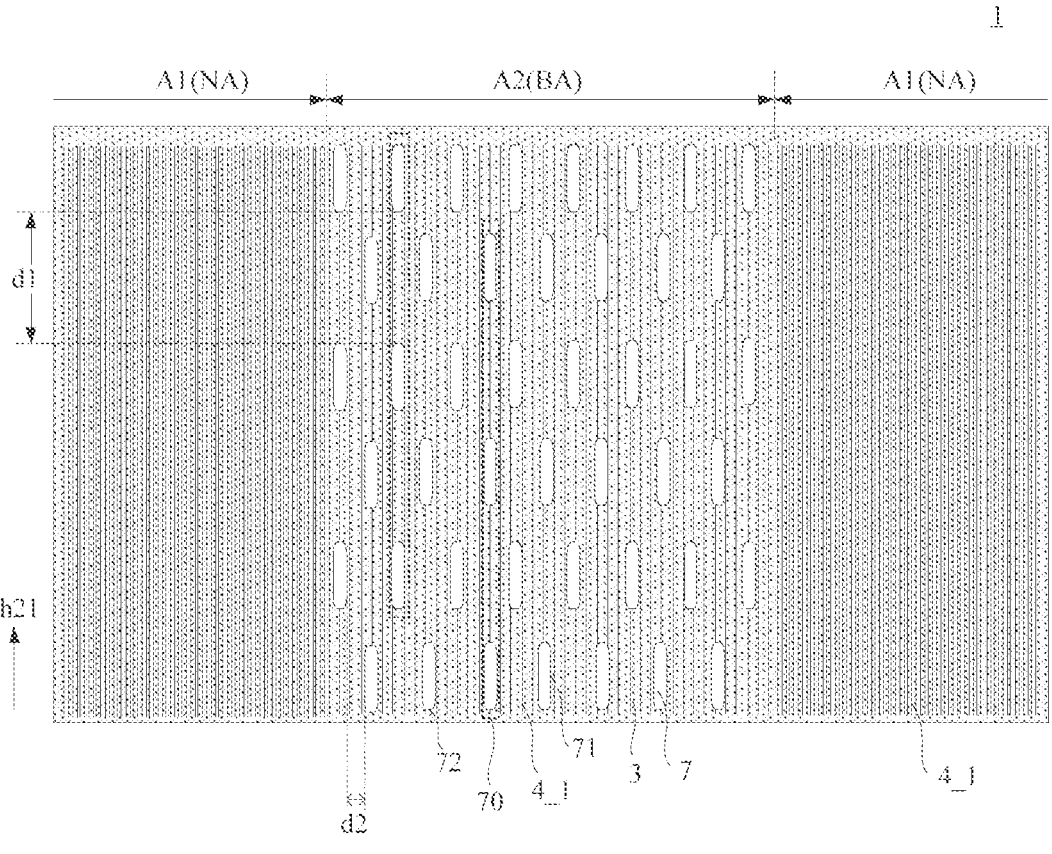
FIG. 13 is a schematic diagram of an orthographic projection of a first layer on the plane of a surface of a support member according to some embodiments of the present disclosure.
Figure 14:
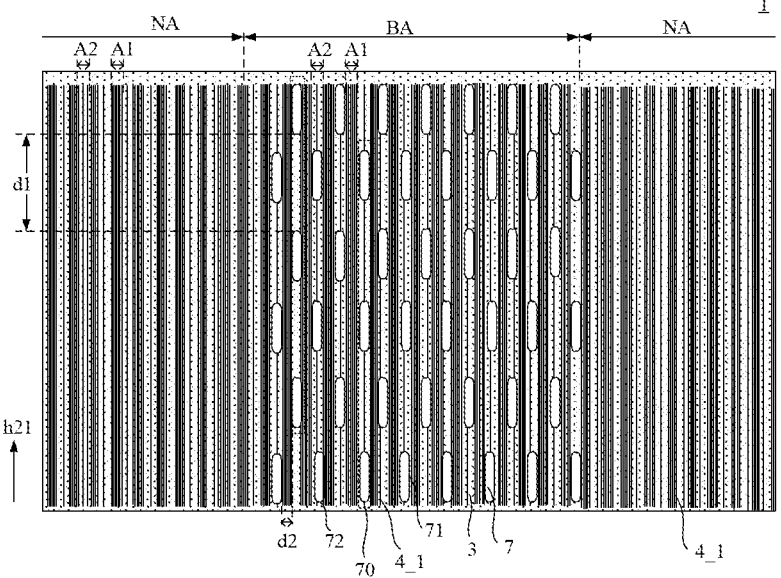
FIG. 14 is a schematic diagram of an orthographic projection of a first layer on the plane of a surface of a support member according to some embodiments of the present disclosure.

When at least one of the first layer 1 or the second layer 2 is provided with the first region A1 and the second region A2 that have different fiber densities, exemplarily, as shown in FIG. 13 and FIG. 14 which are schematic diagrams of the orthographic projections of another two first layers on the plane of a surface of a support member according to the embodiments of the present disclosure, in FIG. 13, the first region A1 is located in the non-bending region NA of the support member 100, and the second region A2 is located in the bending region BA of the support member 100. In FIG. 14, both the bending region BA and the non-bending region NA include the first regions A1 and the second regions A2 that are alternately arranged. As shown in FIG. 13 and FIG. 14, in some embodiments of the present disclosure, the hollows 7 can be provided in the second region A2 having a smaller fiber density. Such configuration can reduce the number of fibers 4 cut by the hollows 7, and can reduce the influence of the hollows 7 on the strength of the support member 100, so that the support member 100 can have both high strength and better bending property.

When the hollows are provided in the support member 100, in some embodiments, as shown in FIG. 13 and FIG. 14, the hollow 7 includes a first edge 71 and a second edge 72 that intersect with each other, and an angle $\alpha 1$ formed between the first edge 71 and the bending axis 5, and an angle $\alpha 2$ formed between the second edge 72 and the bending axis 5 satisfy $0 \leq \alpha 1 < \alpha 2$.

As shown in FIG. 13 and FIG. 14, in some embodiments of the present disclosure, a length of the first edge 71 can be greater than a length of the second edge 72. In FIG. 13 and FIG. 14, the first edge 71 is parallel to the bending axis 5, and the second edge 72 is perpendicular to the bending axis 5. That is, schematically, $\alpha 1 = 0°$, and $\alpha 2 = 90°$. Such configuration is beneficial to increase the area of the hollow 7, improve the bending performance of the support member 100, and enable the support member 100 to achieve a smaller bending radius. On this basis, the length of the second edge 72 forming a larger angle with the bending axis 5 can be smaller, and under the condition that the bending region BA has a certain width, it can be ensured that a relatively large distance is formed between two adjacent hollows 7 in a direction perpendicular to the bending axis 5, which is beneficial to ensure the impact resistance of the support member 100. With such configuration, when the support member 100 is bent with a small bending radius, the support member 100 can also be protected from being damaged due to an excessively small bending radius.

Figure 15:
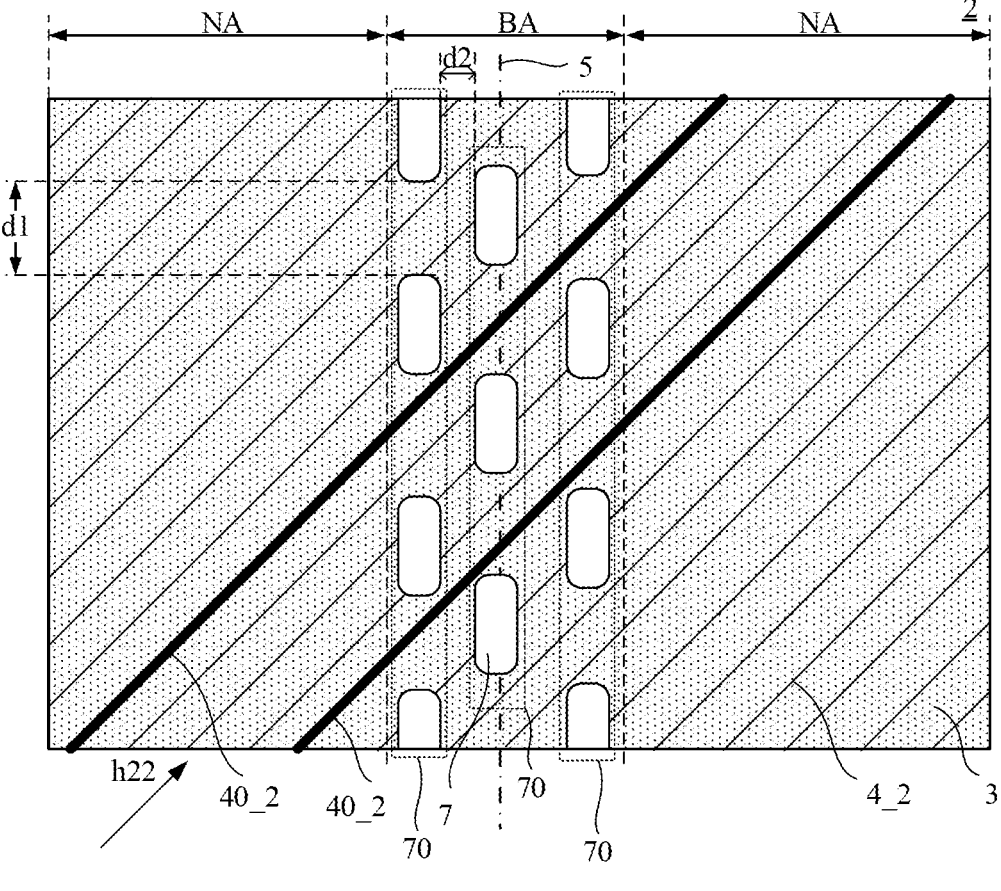
FIG. 15 is a schematic diagram of an orthographic projection of a second layer on a plane of a surface of a support member according to some embodiments of the present disclosure.

Exemplarily, when the first layer 1 is provided on a side of the second layer 2 close to the surface of the support member 100, in some embodiments of the present disclosure, the second layer 2 can include at least one fiber 4 continuously penetrating the bending region BA. In the direction perpendicular to the bending axis 5, the fibers 4 continuously penetrating the bending region BA are located between two adjacent hollows 7. FIG. 15 is a schematic diagram of an orthographic projection of a second layer on a plane of a surface of a support member according to some embodiments of the present disclosure. As shown in FIG. 15, 40_2 corresponding to a thick solid line represents the fiber continuously penetrating the bending region BA. The fiber continuously penetrating the bending region BA means that the fiber has no cut-off point in the bending region BA. Such configuration can reduce the number of fibers cut off by the hollow 7 in the second layer 2, which is beneficial to ensure the strength of the second layer 2.

Figure 16:
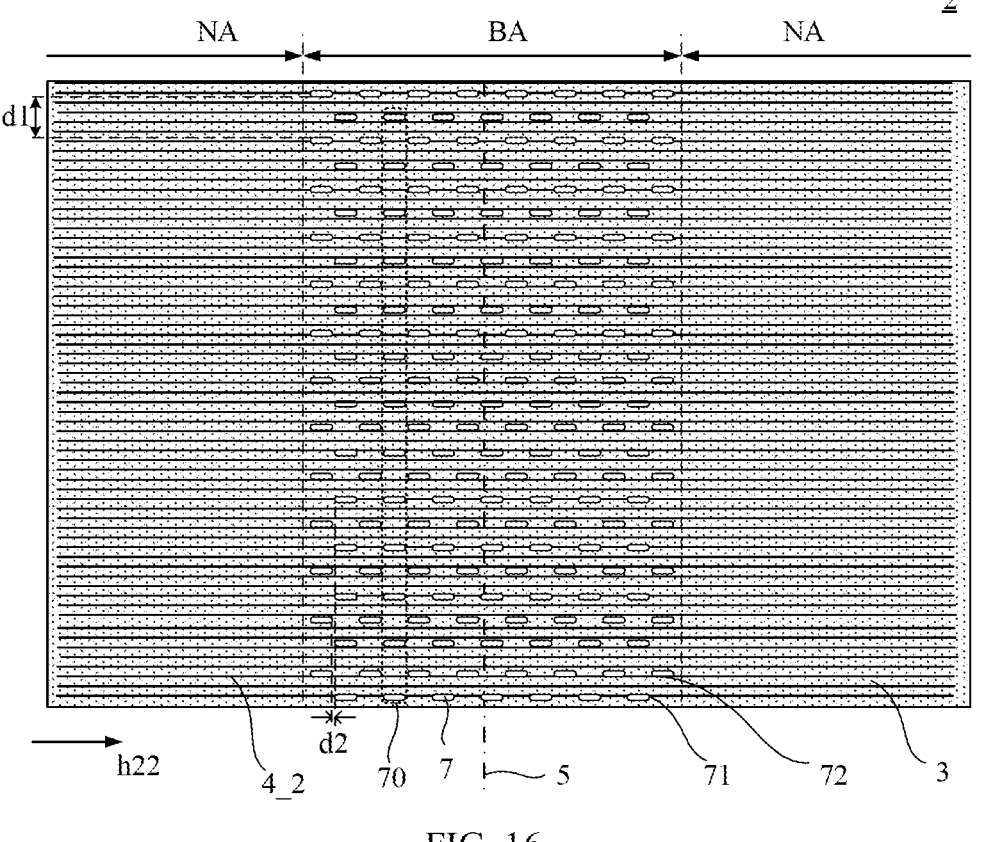
FIG. 16 is a schematic diagram of an orthographic projection of a second layer on a plane of a surface of a support member according to some embodiments of the present disclosure.

FIG. 16 is a schematic diagram of an orthographic projection of a second layer on a plane of a surface of a support member according to some embodiments of the present disclosure. In some embodiments, as shown in FIG. 16, the length of the first edge 71 can be smaller than the length of the second edge 72 so as to reduce the number of fibers 4_2 cut off by the second layer 2 in the bending region BA, thereby improving the strength of the bending region BA.

Exemplarily, the hollow 7 can have a polygon or ellipse shape. FIG. 13, FIG. 14, FIG. 15, and FIG. 16 schematically show that the shape of the hollow 7 is a rounded rectangle.

Exemplarily, as shown in FIG. 13, FIG. 14, FIG. 15, and FIG. 16, the bending region BA includes multiple hollow groups 70 arranged in the direction perpendicular to the bending axis 5, the hollow group 70 includes multiple hollows 7 that are arranged along the extending direction of the bending axis 5, and two adjacent hollow groups 70 are staggered along the direction perpendicular to the bending axis 5.

In some embodiments, as shown in FIG. 13, FIG. 14, FIG. 15, and FIG. 16, a distance d1 between two adjacent hollows 7 in the hollow group 70, and a distance d2 between two adjacent hollow groups 70 satisfy d1>d2, so that the overall supportability and bending recovery performance of the support member 100 are increased, and the impact resistance of the support member 100 is improved while achieving a small bending radius of the support member 100.

In the embodiments of the present disclosure, in at least one of the first layer 1 or the second layer 2, the number n of fibers 4 cut off by one hollow 7 satisfies 0<n≤270, where n is an integer. With such configuration, it can be avoided that the hollow 7 cuts a large quantity of fibers 4. After the fiber 4 is cut off, the resistance to tension and compression of the corresponding layer will be affected. In some embodiments of the present disclosure, by setting the number of fibers 4 cut off by hollows 7 in at least one of the first layer 1 or the second layer 2 to be less than 270, it can be ensured that the support member 100 have good resistance to tension and compression. The fiber 4 cut off by the hollow 7 means that an end of the fiber 4 ends at the edge of the hollow 7, and the extending line of the fiber 4 passes through hollow 7.

Exemplarily, when the first layer 1 is provided on the side of the second layer 2 close to the surface of the support member 100, the number n1 of fibers 4_1 in the first layer 1 cut off by one hollow 7, and the number n2 of fibers 4_2 in the second layer 2 cut off by one hollow 7 satisfy n2≥n1, where both n1 and n2 are integers. Since the first layer 1 is located on the side of the second layer 2 close to the surface of the support member 100, when the support member 100 is bent, the first layer 1 is subjected to a relatively large bending stress. In some embodiments of the present disclosure, the number of fibers 4_1 in the first layer 1 cut off by the hollow 7 is small, which can ensure stronger resistance to tension and compression of the first layer 1. Exemplarily, 7≤n1≤36, and 70≤n2≤270.

Figure 17:
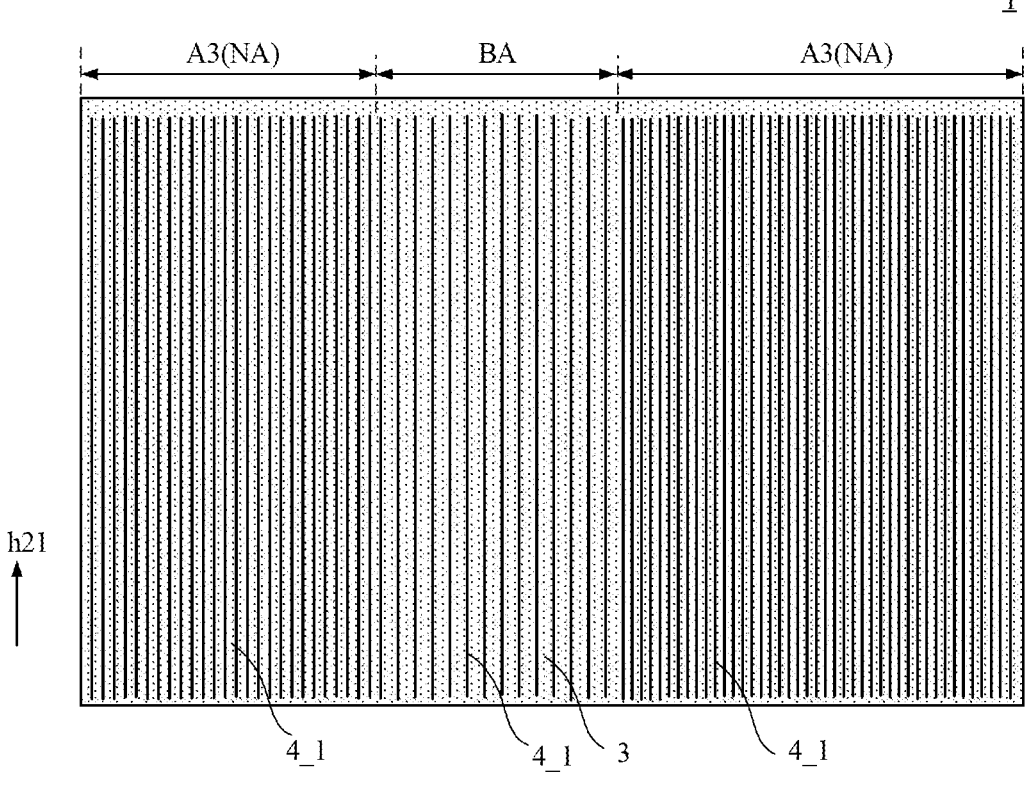
FIG. 17 is a schematic diagram of an orthographic projection of a first layer on the plane of a surface of a support member, according to some embodiments of the present disclosure.
Figure 18:
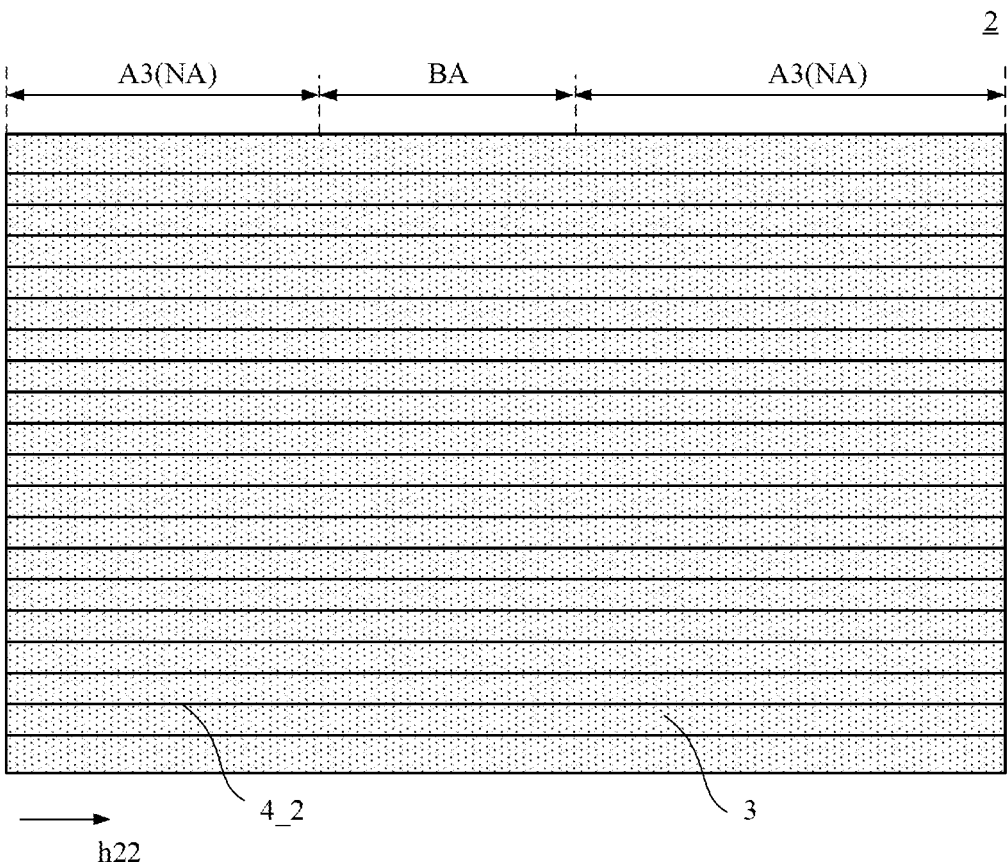
FIG. 18 is a schematic diagram of an orthographic projection of a second layer on a plane of a surface of a support member according to some embodiments of the present disclosure.

Exemplarily, when the first layer 1 is provided on the side of the second layer 2 close to the surface of the support member 100, a third region A3 can be provided in the support member 100. In the third region A3, the fiber density of the first layer 1 is greater than the fiber density of the second layer 2. FIG. 17 is a schematic diagram of an orthographic projection of a first layer on the plane of a surface of a support member, according to some embodiments of the present disclosure, and FIG. 18 is a schematic diagram of an orthographic projection of a second layer on a plane of a surface of a support member according to some embodiments of the present disclosure. As shown in FIG. 17 and FIG. 18, in the third region A3, the fiber density in the first layer 1 is greater than the fiber density in the second layer 2.

Exemplarily, in the third region A3, the fiber 4_1 of the first layer 1 extends along the first direction h21, and the fiber 4_2 of the second layer 2 extends along the second direction h22. FIG. 17 and FIG. 18 schematically shows that the first direction h21 and the second direction h22 are perpendicular to each other.

In some embodiments, as shown in FIG. 17 and FIG. 18, the support member 100 includes a bending region BA and a non-bending region NA. In some embodiments of the present disclosure, the third region A3 can be provided in the non-bending region NA of the support member 100. Exemplarily, when the support member 100 is employed in a foldable display apparatus with touch function, the non-bending region NA of the foldable display apparatus will be frequently subjected to actions such as pressing. In some embodiments of the present disclosure, by increasing the fiber density of a part of the non-bending region BA of the first layer 1 close to the surface of the support member 100, the impact resistance of the support member 100 can be improved.

In some embodiments of the present disclosure, the third region A3 can be set in the bending region BA. That is, in the bending region BA of the support member, the fiber density in the first layer 1 is larger than the fiber density in the second layer 2 to improve the impact resistance of the bending region BA of the first layer 1.

In some embodiments of the present disclosure, at least two third regions A3 can be provided in the support member 100, at least one of the third regions A3 can be provided in the bending region BA, and at least another third region A3 can be provided in the non-bending region NA. In the third region A3 located in the bending region BA, the fiber density in the first layer 1 is made larger than the fiber density in the second layer 2. In the third region A3 located in the non-bending region NA, the fiber density in the first layer 1 is set to be greater than the fiber density in the second layer 2.

Figure 19:
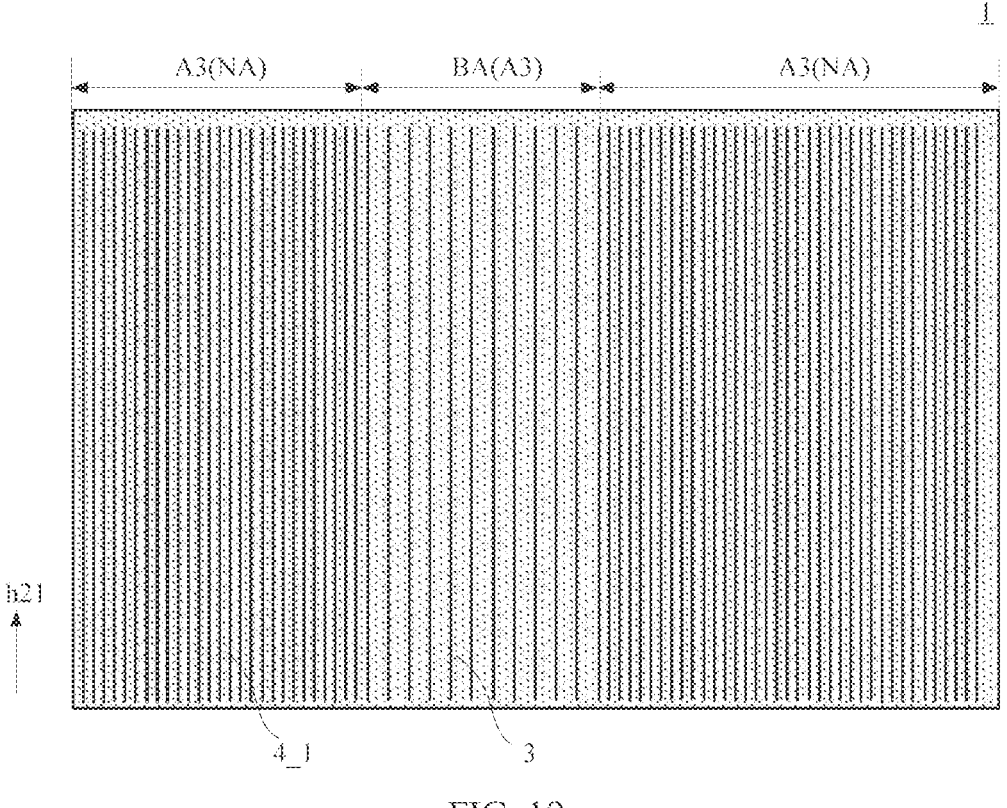
FIG. 19 is a schematic diagram of an orthographic projection of a first layer on the plane of a surface of a support member according to some embodiments of the present disclosure.
Figure 20:
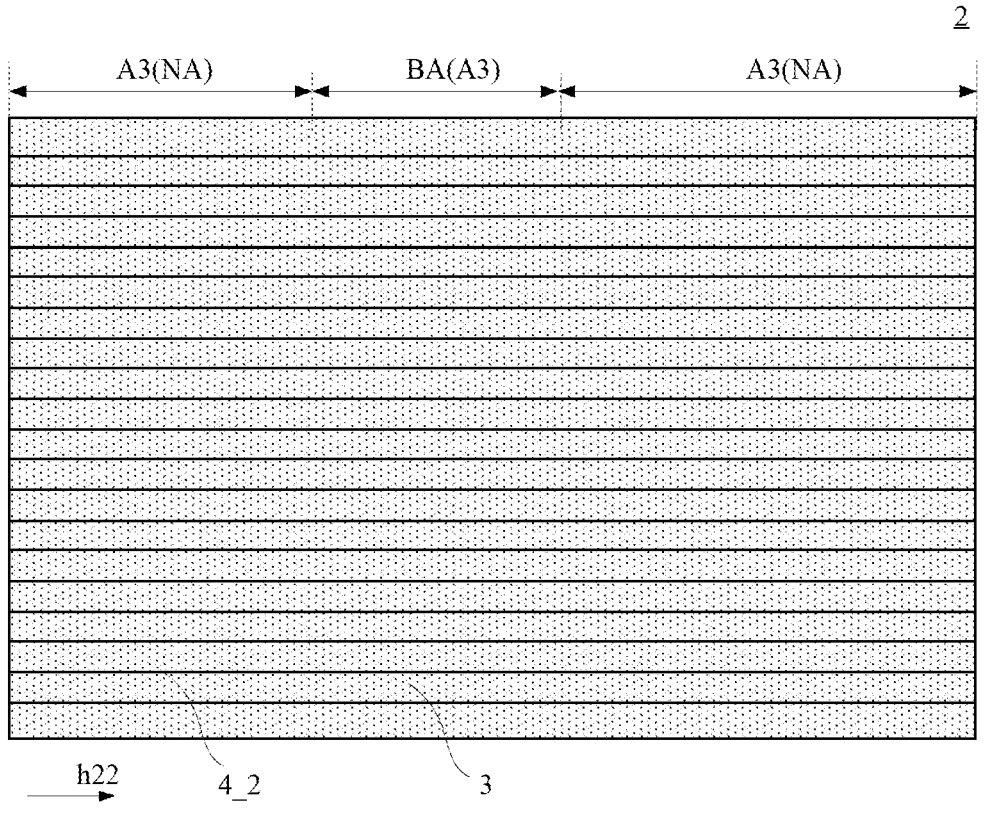
FIG. 20 is a schematic diagram of an orthographic projection of a second layer on a plane of a surface of a support member according to some embodiments of the present disclosure.

Exemplarily, the support member 100 includes two third regions A3, one of the two third regions A3 is located in the bending region BA of the support member 100, and the other one of the two third regions A3 is located in the non-bending region NA of the support member 100. FIG. 19 is a schematic diagram of an orthographic projection of a first layer on the plane of a surface of a support member according to some embodiments of the present disclosure, and FIG. 20 is a schematic diagram of an orthographic projection of a second layer on a plane of a surface of a support member according to some embodiments of the present disclosure. As shown in FIG. 19 and FIG. 20, in two third regions A3, the fiber density in the first layer 1 is greater than the fiber density in the second layer 2.

Exemplarily, when the first layer 1 is provided on the side of the second layer 2 close to the surface of the support member 100, in the first layer 1, the fiber density a11 in the non-bending region NA satisfies 80%≤a11≤95%, the fiber density a12 in the bending region BA satisfies 30%≤a12≤45%. In the second layer 2, the fiber density a21 in the non-bending region NA satisfies 60%≤a21≤75%, and the fiber density a22 in the bending region BA satisfies 60%≤a22≤75%. In some embodiments of the present disclosure, by setting the fiber densities of different regions in the first layer 1 and the second layer 2 within the above ranges, on the one hand, the fiber density can be not excessively large, which is beneficial to reduce the processing difficulty while reducing the possibility of brittle fracture of the support member 100. On the other hand, it is avoided to set the fiber density to be excessively small. When the support member 100 is bent, the matrix 3 can be avoided to be a main stress-bearing component, which can reduce the possibility of the fibers 4 being pulled apart, and it is beneficial to ensure the strength of the support member 100.

FIG. 19 and FIG. 20 schematically show that the fiber densities of two third regions A3 in the first layer 1 of the support member 100 are different, and the fiber densities in the two third regions A3 of the second layer 2 are the same. In some embodiments of the present disclosure, according to the aforementioned setting method, the fiber density in the third region A3 of the bending region BA of the first layer 1 in the support member 1 can be the same as the fiber density in the third region A3 of the non-bending region NA, and/or, the fiber density in the third region A3 of the bending region BA of the second layer 2 of the support member 100 is set to be smaller than the fiber density in the third region A3 of the non-bending region NA, which will not be shown in the drawings.

Figure 21:
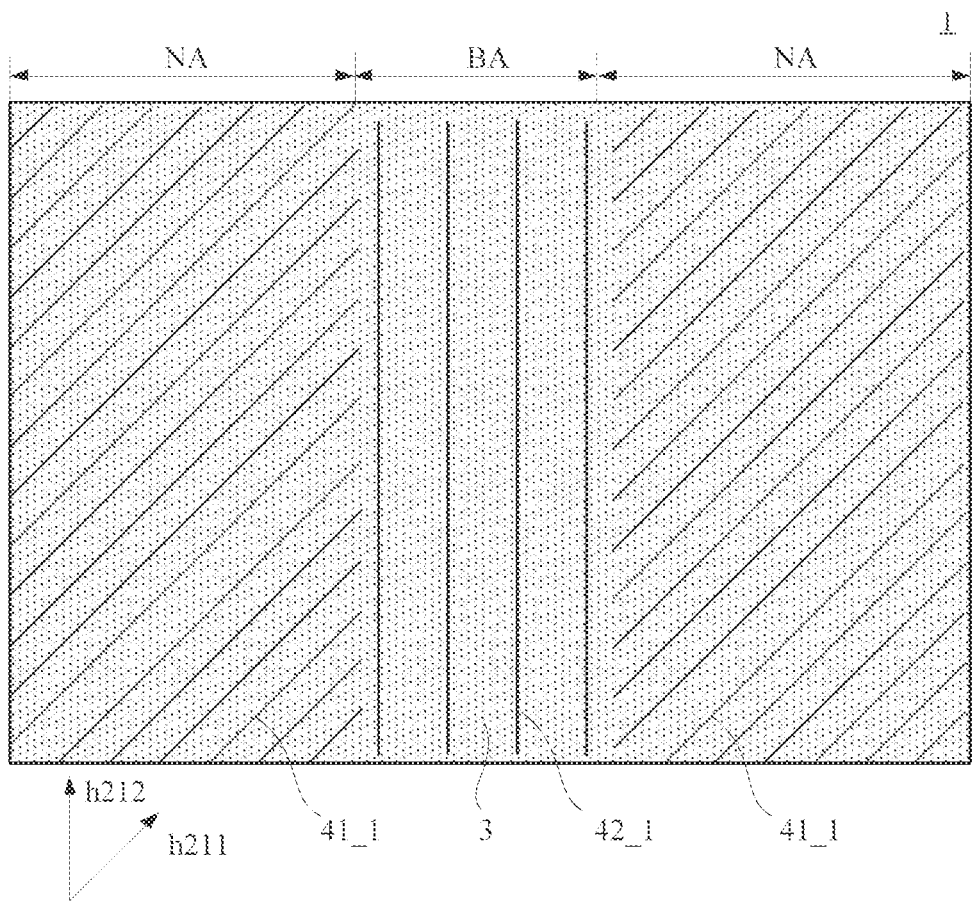
FIG. 21 is a schematic diagram of an orthographic projection of a first layer on the plane of a surface of a support member according to some embodiments of the present disclosure.

Exemplarily, the support member 100 includes a bending region BA and a non-bending region NA, and the support member 100 is folded about the bending axis 5. In at least one of the first layer 1 or the second layer 2, the fibers 4 include a first fiber 41 and a second fiber 42 that extend in different directions. FIG. 21 is a schematic diagram of an orthographic projection of a first layer on the plane of a surface of a support member according to some embodiments of the present disclosure. As shown in FIG. 21, the first layer 1 includes a first fiber 41_1 and a second fiber 42_1 that extend in different directions. Exemplarily, the extending directions of the first fiber 41_1 and the second fiber 42_1 in the first layer 1 are different from the extending direction of the fiber (not shown in FIG. 21) in the second layer. As shown in FIG. 21, the first fibers 41_1 extend along the first sub-direction h211, and the second fibers 42_1 extend along the second sub-direction h212. With such configuration, it is avoided to set the fiber to be excessively long, and when the support member 100 is bent, the problem of uneven stress at different positions of the fiber can be improved, thereby increasing the reliability of the fiber.

Exemplarily, as shown in FIG. 21, in some embodiments of the present disclosure, the first fibers 41_1 can be provided in the bending region BA, and the second fibers 42_1 can be provided in the non-bending region NA. With such configuration, the same fiber 4 can be prevented from extending from the non-bending region NA to the bending region BA, it is avoided that some positions of the same fiber 4 located in the bending region BA, and some positions of the same fiber 4 are located in the non-bending region NA. When the supporting member 100 is bent, cracks can be avoided due to excessive stress supplied on some positions of the same fiber 4.

Exemplarily, the extending directions of the first fiber 41 and the second fiber 42 can be set according to the stresses at their respective positions, so that respective different regions in the first layer 1 and/or the second layer 2 can fully use fibers to increase the strength at the corresponding positions. In some embodiments, when the first fibers 41 are provided in the bending region BA, and the second fibers 42 are provided in the non-bending region NA, an angle formed between the extending direction of the first fiber 41_1 and the extending direction of the bending axis 5 is smaller than an angle formed between the extending direction of the second fiber 41_2 and the extending direction of the bending axis 5. As shown in FIG. 21, the first fibers 41 are parallel to the bending axis 5, that is, schematically, the angle between the first fiber 41 and the bending axis 5 is set as 0°.

Figure 22:
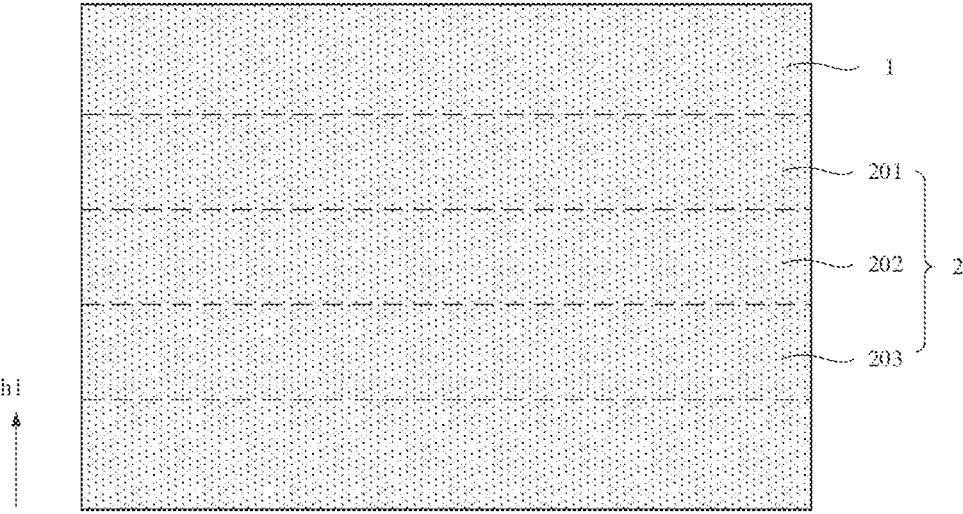
FIG. 22 is a sectional view of a support member according to some embodiments of the present disclosure.
Figures 23, 24:
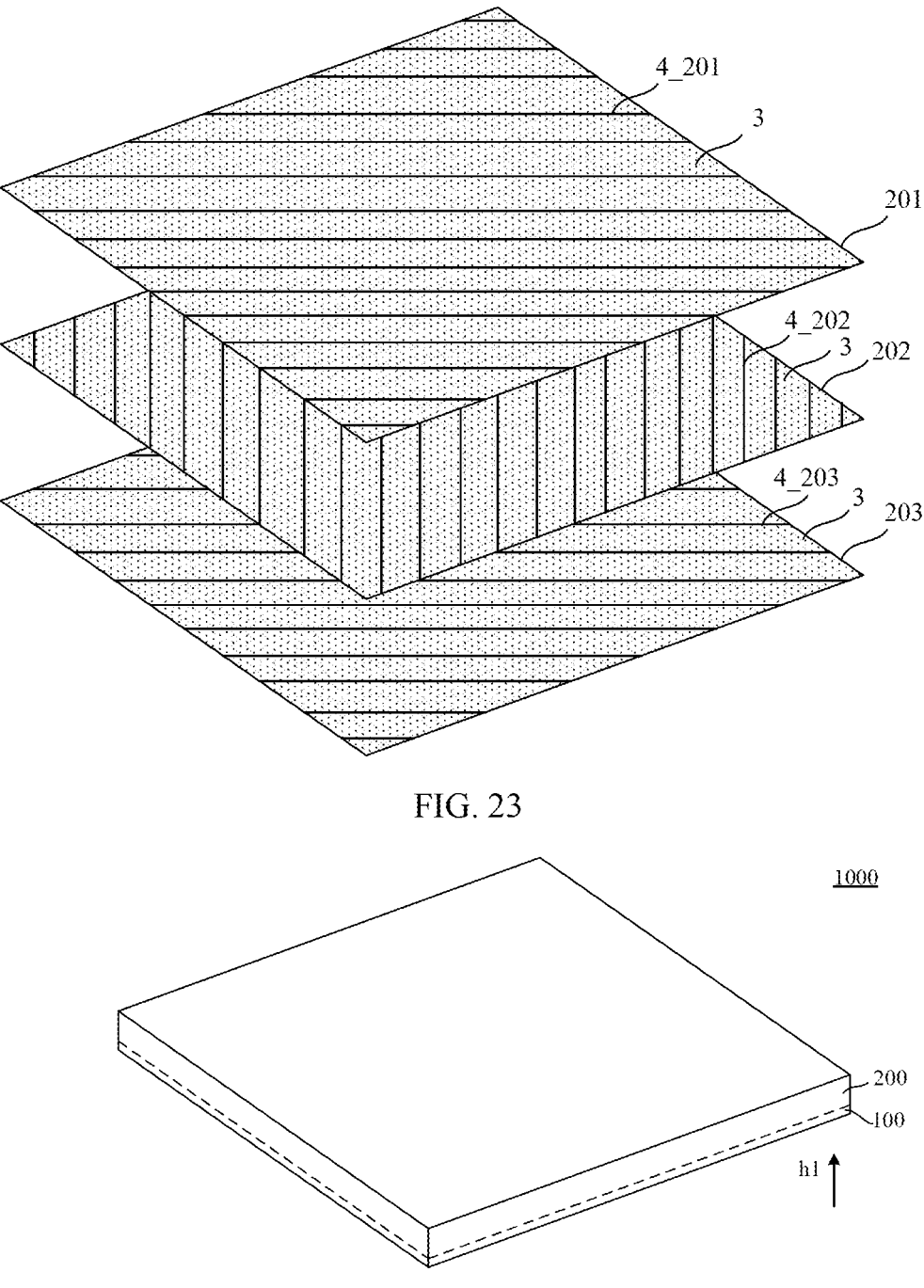
FIG. 23 is a schematic diagram of fiber extending directions of each sub-layer in the second layer of a support member according to some embodiments of the present disclosure.
FIG. 24 is a perspective view of a display module according to some embodiments of the present disclosure.

Exemplarily, in some embodiments of the present disclosure, the first layer 1 can be provided on the side of the second layer 2 close to the surface of the support member. FIG. 22 is a sectional view of a support member according to some embodiments of the present disclosure, and FIG. 23 is a schematic diagram of fiber extending directions of each sub-layer in the second layer of a support member according to some embodiments of the present disclosure. As shown in FIG. 22 and FIG. 23, the second layer 2 includes at least two sub-layers 20 that are stacked. The extending direction of the fiber 4 in one sub-layer of two adjacent sub-layers 20 is different from the extending direction of the fiber 4 in another sub-layer of the two adjacent sub-layers 20. That is, the fibers in the second layer 2 cross and are stacked to finely adjust the strength of the support member 100, which is beneficial to improve the strength and elastic modulus of the support member 100 and improve the bending recovery of the support member 100 while improving the impact resistance of the support member 100.

Exemplarily, as shown in FIG. 23, multiple sub-layers 20 include a first sub-layer 201, a second sub-layer 202, and a third sub-layer 203 that are stacked along the thickness direction h1 of the support member 100. The second sub-layer 202 is located between the first sub-layer 201 and the third sub-layer 203. An angle β1 is formed between the fiber 4_201 in the first sub-layer 201 and the fiber 4_202 in the second sub-layer 202, and an angle β2 is formed between the fiber 4_202 in the second sub-layer 202 and the fiber 4_203 in the third sub-layer 203, where, β1=β2. Exemplarily, in some embodiments of the present disclosure, when the second sub-layer 202 can be set close to a neutral plane of the support member 100, by setting β1=β2, the stress conditions of the layers on both sides of the neutral plane tend to be consistent, which facilitates fine adjustment of the structure of the support member 100.

Figure 25:
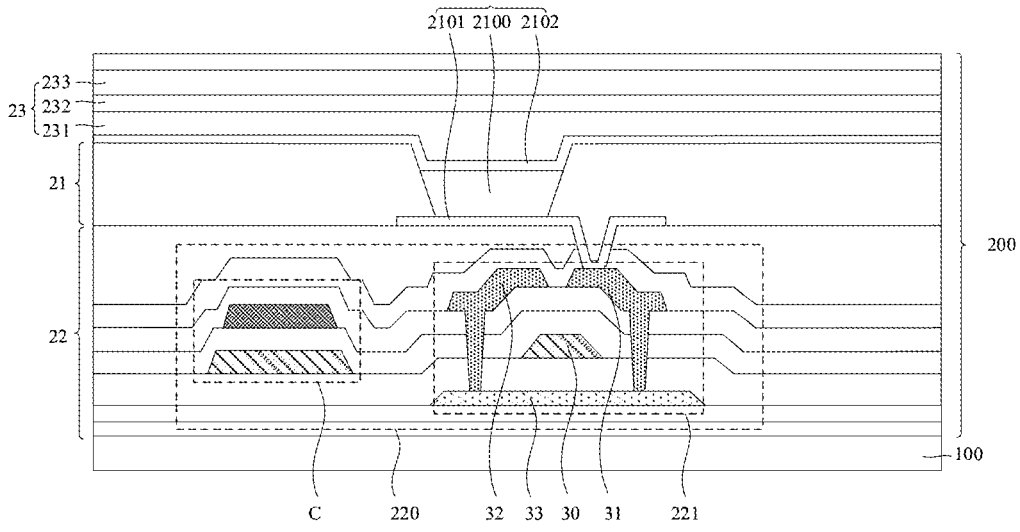
FIG. 25 is a sectional view of a display module according to some embodiments of the present disclosure.

Some embodiments of the present disclosure provide a display module. FIG. 24 is a perspective view of a display module according to some embodiments of the present disclosure, and FIG. 25 is a sectional view of a display module according to some embodiments of the present disclosure. As shown in FIG. 24 and FIG. 25, a display module 1000 includes the support member 100 and a flexible display panel 200. The support member 100 is located on the side of the flexible display panel 200 away from a light-emitting side. The support member 100 and the flexible display panel 200 are stacked in the thickness direction h1 of the display module 1000. The specific structure of the support member 100 has been described in detail in the above embodiments and will not be repeated herein.

Exemplarily, the flexible display panel 200 includes any one of an organic light-emitting display panel, an inorganic light-emitting display panel, and a quantum dot light-emitting display panel. The support member 100 can have functions such as supporting the flexible display panel 200 and dissipating heat of the flexible display panel 200.

As shown in FIG. 25, the flexible display panel 200 includes a light-emitting layer 21 and an array layer 22. The light-emitting layer 21 includes a light-emitting element 210. The array layer 22 includes a pixel circuit 220. The light-emitting element 210 is electrically connected to the pixel circuit 220. The light-emitting element 210 includes a first electrode 2101, a light-emitting layer 2100, and a second electrode 2102 that are stacked. The pixel circuit 220 includes a thin film transistor 221 and a storage capacitor C. The numbers of the thin film transistor 221 and the storage capacitors C in the pixel circuit 22 can be adjusted according to different design requirements, which are not limited in the embodiments of the present disclosure. FIG. 25 only schematically shows one thin film transistor 221 is electrically connected to the light-emitting element 210. As shown in FIG. 25, the thin film transistor 221 includes a gate 30, a first electrode 31, a second electrode 32, and a channel layer 33. One of the first electrode 31 and the second electrode 32 is a source, and the other one of the first electrode 31 and the second electrode 32 is a drain.

Exemplarily, as shown in FIG. 25, the flexible display panel 200 also includes an encapsulation layer 23 located on the side of the light-emitting element 210 close to the light-emitting side of the flexible display panel 200. In some embodiments, the encapsulation layer 23 can adopt thin film encapsulation (TFE). As shown in FIG. 25, the encapsulation layer 23 includes a first inorganic encapsulation layer 231, an organic encapsulation layer 232, and a second inorganic encapsulation layer 233 that are stacked.

In the display module provided by the embodiments of the present disclosure, by providing the support member 100 in which a matrix and fibers dispersed in the matrix are provided, the resistance to tension and compression of the support member 100 can be increased. With such configuration, on the basis of ensuring the resistance to tension and compression of the support member 100, there is no need to provide a support plate made of a metal material such as stainless steel in the support member 100, so that the support member 100 can have better heat dissipation characteristics and lighter weight, thereby achieving a non-magnetic design of the support member 100. When the support member 100 is employed in the display apparatus, assembling the whole device is not affected, and the electrical signals in the display apparatus are not interfered.

In some embodiments of the present disclosure, by optimizing the design of the fibers in the support member 100, the first layer and the second layer arranged in the thickness direction of the support member 100 are provided in the support member 100, and the extending directions of the fibers in the first layer and the second layer are different. The extending directions of the fibers in the first layer and the second layer can be set according to the positions of the layers in the support member 100, so that the fibers in the first layer and the fibers in the second layer cooperated with each other to comprehensively improve the various properties required by the support member 100, the support member 100 has better bending recovery to alleviate the crease while improving the strength and the impact resistance of the support member 100.

Figure 26:
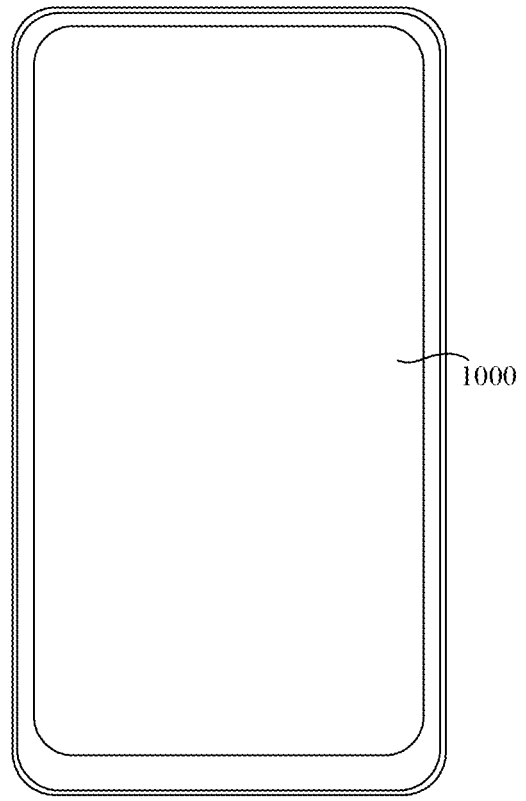
FIG. 26 is a top view of a display apparatus according to some embodiments of the present disclosure.

Some embodiments of the present disclosure provide a display apparatus. FIG. 26 is a top view of a display apparatus according to some embodiments of the present disclosure. As shown in FIG. 26, the display apparatus includes the display module 1000. The specific structure of the display module 1000 has been described in detail in the above embodiments, which will not be repeated herein. FIG. 26 only schematically shows the display apparatus which can be any electronic device with a display function, such as a mobile phone, a tablet computer, a laptop computer, an electronic paper book, or a television.

The above embodiments are merely some embodiments of the present disclosure, which, as mentioned above, are not used to limit the present disclosure. Whatever within the principles of the present disclosure, including any modification, equivalent substitution, improvement, etc., shall fall into the scope of the present disclosure.

What is claimed is:

1. A display module, comprising a flexible display panel and a support member, wherein the support member is located on a side of the flexible display panel away from a light-emitting side and comprises at least one first layer and a second layer that are stacked along a thickness direction of the support member, wherein each of the at least one first layer and the second layer comprises a matrix and fibers, wherein the fibers in the matrix are dispersed in the matrix; and on a plane parallel to a surface of the support member, an angle $\alpha$ formed between an extending direction of the fibers in one first layer of the at least one first layer and an extending direction of the fibers in the second layer satisfies $\alpha>0°$;

wherein the one first layer is located on a side of the second layer close to a surface of the support member, and the one first layer has a thickness smaller than a thickness of the second layer; and the support member has a bending region, and the support member is foldable about a bending axis, wherein an angle $\theta1$ formed between an extending direction of the bending axis and the extending direction of the fibers in the one first layer, and an angle $\theta2$ formed between the extending direction of the bending axis and the extending direction of the fibers in the second layer are both acute angles and satisfy $\theta2>\theta1$.

2. The display module according to claim 1, wherein $\theta1=0°$, and $\alpha=90°$; or wherein $\theta1=0°$, and $10°\leq\alpha\leq80°$.

3. The display module according to claim 1, further comprising:

a spacer layer provided between the one first layer and the second layer, wherein the spacer layer comprises a matrix and fibers, wherein an extending direction of the fibers in the spacer layer is different from the extending direction of the fibers in the one first layer, and is also different from the extending direction of the fibers in the second layer; and wherein an angle $\theta3$ is formed between the extending direction of the bending axis and the extending direction of the fibers in the spacer layer, where $\theta1<\theta3<\theta2$.

4. The display module according to claim 1, wherein at least one of the one first layer or the second layer has at least one first region and at least one second region, and the at least one first region has a greater fiber density than the at least one second region.

5. The display module according to claim 4, wherein the support member has a bending region and a non-bending region, wherein the non-bending region comprises the at least one first region, and the bending region comprises the at least one second region.

6. The display module according to claim 4, wherein the at least one first region comprises at least two first regions, the at least one second region comprises at least two second regions, and the support member has a bending region and a non-bending region, wherein in the non-bending region, at least one of the one first layer or the second layer comprises the at least two first regions and the at least two second regions that are alternately arranged.

7. The display module according to claim 6, wherein the support member is provided with hollows located in the bending region and located in the at least two second regions.

8. The display module according to claim 1, wherein the one first layer is located on a side of the second layer close to a surface of the support member;

wherein the support member has a third region, wherein in the third region, the one first layer has a greater fiber density than the second layer; and wherein the support member has a bending region and a non-bending region, wherein the third region is located in at least one of the bending region and the non-bending region.

9. The display module according to claim 1, wherein the support member has a bending region and a non-bending region;

the support member is provided with hollows located in the bending region; and in one of the one first layer and the second layer, a number n of at least one fiber of the fibers that is cut off by one of the hollows satisfies n≤270.

10. The display module according to claim 9, wherein the one first layer is located on a side of the second layer close to a surface of the support member; and in the one first layer, a number of at least one fiber of the fibers that is cut off by one of the hollows is n1, and in the second layer, a number of another at least one fiber of the fibers that is cut off by another one of the hollows is n2, where n2≥n1.

11. The display module according to claim 1, wherein the support member is provided with hollows located in the bending region;

at least one hollow of the hollows comprises a first edge and a second edge that intersect with each other, wherein an angle α1 formed between the first edge and the bending axis and an angle α2 formed between the second edge and the bending axis satisfy 0≤α1<α2, and the first edge has a greater length than the second edge.

12. The display module according to claim 11, wherein the fibers in the second layer comprise at least one fiber continuously penetrating the bending region, and the least one fiber is located between adjacent hollows of the hollows in a direction perpendicular to the bending axis.

13. The display module according to claim 1, wherein the support member is provided with hollows located in the bending region;

at least one hollow of the hollows comprises a first edge and a second edge that intersect with each other, wherein an angle α1 formed between the first edge and the bending axis and an angle α2 formed between the second edge and the bending axis satisfy 0≤α1<α2; and the first edge has a smaller length than the second edge.

14. The display module according to claim 1, wherein the support member is provided with hollows located in the bending region;

the bending region comprises hollow groups arranged in a direction perpendicular to the bending axis, wherein each hollow group of the hollow groups comprises at least two hollows of the hollows, wherein the at least two hollows are arranged along the extending direction of the bending axis, and two adjacent hollow groups of the hollow groups are staggered along the extending direction of the bending axis; and a distance d1 formed between two adjacent hollows in one hollow group of the hollow groups and a distance d2 formed between two adjacent hollow groups of the hollow groups satisfy d1>d2.

15. The display module according to claim 1, wherein the one first layer is located on a side of the second layer close to a surface of the support member;

the second layer comprises at least two sub-layers that are stacked, wherein a fiber of the fibers in one sub-layer of two adjacent sub-layers of the at least two sub-layers and a fiber of the fibers in another sub-layer of the two adjacent sub-layers extend in different directions;

the at least two sub-layers comprise a first sub-layer, a second sub-layer, and a third sub-layer that are stacked along the thickness direction of the support member, wherein the second sub-layer is located between the first sub-layer and the third sub-layer; and an angle β1 formed between a fiber of the fibers that is located in the first sub-layer and a fiber of the fibers that is located in the second sub-layer, and an angle β2 formed between a fiber of the fibers that is located in the second sub-layer and a fiber of the fibers that is located in the third sub-layer satisfy β1=β2.

16. The display module according to claim 1, wherein the matrix is made of at least one material comprising resin; and the fibers comprise at least one of carbon fiber, silicon carbide fiber, or glass fiber.

17. A display apparatus, comprising a display module according to claim 1.

18. A display module, comprising a flexible display panel and a support member, wherein the support member is located on a side of the flexible display panel away from a light-emitting side and comprises at least one first layer and a second layer that are stacked along a thickness direction of the support member, wherein each of the at least one first layer and the second layer comprises a matrix and fibers, wherein the fibers in the matrix are dispersed in the matrix; and on a plane parallel to a surface of the support member, an angle α formed between an extending direction of the fibers in one first layer of the at least one first layer and an extending direction of the fibers in the second layer satisfies α>0°;

wherein at least one of the one first layer or the second layer has at least one first region and at least one second region, and a spacing between any adjacent fibers in the at least one first region is smaller than a spacing between any adjacent fibers in the at least one second region.

19. A display module, comprising a flexible display panel and a support member, wherein the support member is located on a side of the flexible display panel away from a light-emitting side and comprises at least one first layer and a second layer that are stacked along a thickness direction of the support member, wherein each of the at least one first layer and the second layer comprises a matrix and fibers, wherein the fibers in the matrix are dispersed in the matrix; and on a plane parallel to a surface of the support member, an angle α formed between an extending direction of the fibers in one first layer of the at least one first layer and an extending direction of the fibers in the second layer satisfies α>0°;

wherein the support member is provided with hollows located in the bending region;

the bending region comprises hollow groups arranged in a direction perpendicular to the bending axis, wherein each hollow group of the hollow groups comprises at least two hollows of the hollows, wherein the at least two hollows are arranged along the extending direction of the bending axis, and two adjacent hollow groups of the hollow groups are staggered along the extending direction of the bending axis; and a distance d1 formed between two adjacent hollows in one hollow group of the hollow groups and a distance d2 formed between two adjacent hollow groups of the hollow groups satisfy d1>d2.

\* \* \* \* \*